(12) United States Patent
Chidambaram et al.

(10) Patent No.: US 12,740,454 B2
(45) Date of Patent: Sep. 15, 2026

(54) MICROELECTRONIC ASSEMBLIES WITH DIRECT BONDING USING NANOTWINNED COPPER

(71) Applicant: Intel Corporation, Santa Clara, CA (US)

(72) Inventors: Vivek Chidambaram, Singapore (SG); Jonathan Burk, Portland, OR (US); Zhihua Zou, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/194,702

(22) Filed: Apr. 3, 2023

(65) Prior Publication Data

US 2024/0332237 A1 Oct. 3, 2024

(51) Int. Cl.
*H10W 70/685* (2026.01)
*H10W 70/60* (2026.01)
(Continued)

(52) U.S. Cl.
CPC ........ *H10W 70/685* (2026.01); *H10W 70/611* (2026.01); *H10W 90/00* (2026.01);
(Continued)

(58) Field of Classification Search
CPC .................................................. H10W 80/327
See application file for complete search history.

(56) References Cited

U.S. PATENT DOCUMENTS

2012/0135260 A1* 5/2012 Jang ....................... C25D 5/022 205/112
2012/0252189 A1* 10/2012 Sadaka ............... H10P 90/1914 438/455

(Continued)

FOREIGN PATENT DOCUMENTS

DE 102019115275 A1 1/2020
EP 1490903 B1 2/2015

(Continued)

OTHER PUBLICATIONS

"Capacitor", Wikipedia, Jun. 6, 2020, Retrieved from the internet on 202-Feb. 17, https://en.wikipedia.org/w/index.php?title=Capacitory &oldid-96098607.

(Continued)

*Primary Examiner* — Evren Seven
(74) *Attorney, Agent, or Firm* — Akona IP PC

(57) ABSTRACT

Disclosed herein are microelectronic assemblies with direct bonding using nanotwinned copper (NTC). An example microelectronic assembly may include a first microelectronic component and a second microelectronic component coupled to the first microelectronic component by a direct bonding (DB) region, wherein the DB region includes a DB contact comprising a first portion and a second portion having different microstructures. The first portion is between the first microelectronic component and the second portion. The second portion is between the first portion and the second microelectronic component. In some implementations, the first portion has non-columnar microstructure, and (Continued)

the second portion has columnar microstructure. In some implementations, less than about 40% of grains of the first portion have ac <111> orientation, and at least about 50% of grains of the second portion have the <111> orientation. In some embodiments, the first portion includes PCC or FGC, and the second portion includes NTC.

20 Claims, 16 Drawing Sheets

(51) Int. Cl.
*H10W 72/00* (2026.01)
*H10W 72/20* (2026.01)
*H10W 74/00* (2026.01)
*H10W 74/15* (2026.01)
*H10W 90/00* (2026.01)

(52) U.S. Cl.
CPC .... *H10W 72/07253* (2026.01); *H10W 72/237* (2026.01); *H10W 72/252* (2026.01); *H10W 72/257* (2026.01); *H10W 74/00* (2026.01); *H10W 74/15* (2026.01); *H10W 90/722* (2026.01); *H10W 90/724* (2026.01); *H10W 90/732* (2026.01); *H10W 90/734* (2026.01)

(56) References Cited

U.S. PATENT DOCUMENTS

2013/0249532 A1 9/2013 Lin et al.
2015/0270209 A1 9/2015 Woychik et al.
2016/0190103 A1 6/2016 Kabe et al.
2019/0109042 A1 4/2019 Katkar et al.
2019/0123006 A1 4/2019 Chen et al.
2019/0385977 A1 12/2019 Elsherbini et al.
2020/0126906 A1 4/2020 Uzoh et al.
2020/0266156 A1 8/2020 Lee
2020/0279813 A1 9/2020 Liff et al.
2022/0093492 A1 3/2022 Elsherbini et al.
2022/0093561 A1 3/2022 Eid et al.
2022/0093725 A1 3/2022 Elsherbini et al.
2022/0102305 A1 3/2022 Krishnatreya et al.
2023/0132632 A1* 5/2023 Katkar ................ H10W 20/033 257/690
2023/0307392 A1* 9/2023 Lu ......................... H10W 72/90

FOREIGN PATENT DOCUMENTS

EP 3594994 A1 1/2020
WO 2019132960 A1 7/2019
WO 2019132961 A1 7/2019

OTHER PUBLICATIONS

Chidambarim, Vivek et al "Au-in-based Hermetic Sealing for MEMS Packaging for Down-Hole Application," Journal of Electronic Materials, Published online : Apr. 8, 2014, 12 pages.
Han, Tiancheng et al., "Manipulating Steady Heat Conduction by Sensu-shaped Thermal Metamaterials," Scientific Reports, May 14, 2005, 7 pages.
Jani, Imed et al "BISTs for Post-Bond Test and Electrical Analysis of High Density 3D Interconnect defect", 2018 23rd IEEE European Test Symposium (ETS), 6 pages.
Li, Sujie et al "Nano-scale twinned Cu with ultrahigh strength prepared by direct current electrodeposition," Materials Science & engineering A 758 (2019) 1-6.
Mirkarimi, Laurat et al "The Influence of Cu Microstructure on Thermal Budget in Hybrid Bonding," 2022 IEEE 72nd Electronic Components and Technology Conference (ECTC) retrieved from the internet on Jan. 7, 2023, pp. 162-167.
Sun, Fu-Long et al "Bottom-Up Electrodeposition of Large-Scale Nanotwinned Copper with in 3D Through Silicon Via," Materials, 2018, 11, 319; doi: 10.3390/ma11020319, retrieved from mdpi.com/journal/materials, 7 pages.
Chidambaram, Vivek et al "A comparative assessment of die to wafer hybrid bonding process flow against mature wafer to wafer hybrid bonding process flow", Intel Assembly & Test Technology Journal (IATTJ), vol. 25, 2022, pp. 19-28.
Chidambaram, Vivek et al, U.S. Appl. No. 18/194,702, filed Apr. 3, 2024 entitled "Microelectronic Assemblies with Direct Bonding using Nanotwinned Copper", Inventors Vivek Chidambaram et al, 44 pages.
Fowler, Shelly, "Material Solutions For FOWLP Die Shift And Wafer Warpage" Material Solutions For FOWLP Die Shift And Wafer Warpage, Jun. 20, 2019, retrieved on Mar. 31, 2024 from https://semiengineering.com/material-solutions-for-fowlp-die-shift-and-wafer-warpage/, 5 pages.
Garrou, Phil "FTLE 443: Controlling Warpage and Placement FOWLP" Blogs, Packaging IFTLE, IFTLE 443: Controlling Warpage and Placement Error for FOWLP-3D InCites, retrieved on Mar. 31, 2024 https://www.3dincites.com/2020/03/iftle-443-controlling-warpage-and-placement-error-for-fowlp/, 3 pages.
Iwai, Masahiro et al "Latest Technologies of Epoxy Molding Compound (EMC) for FO-WLP" 53rd International Symposium on Microelectronics, IMAPS 2020, Oct. 5-8, 2020, Virtual Symposium, pp. 000051-000056.
Suhard, Samuel et al "Demonstration of a collective hybrid die-to-wafer integration using glass carrier", 2021 IEEE 71st Electronic Components and Technology Conference (ECTC), pp. 2064-2070.
Uhrmann, Thomas, et al "Heterogeneous Integration By Collective Die-To-Wafer Bonding", Proceeding of the International Wafer-Level Packaging Conference 201, Retrieved on Mar. 31, 2024 from UTC from IEEE Xplore, 4 pages.

* cited by examiner 180
190B
190A
110
108B
108A
108
192B
192A
110B
110A 208B
208A
206
204-1
204-2
202

208B
208A
232A
210A
204-1
204-2
202

210B
232B
232A
210A
204-1
204-2
202
208B
208A 210B
232B
232A
210A
204-1
204-2
202-2
202-1
204-2
204-1
180-B
208B
208A
180-A 232A
210A
204-1
204-2
212
202
208B
208A 232B
232A
210A
204-1
204-2
210B
202
208B
208A
180

MICROELECTRONIC ASSEMBLIES WITH DIRECT BONDING USING NANOTWINNED COPPER

BACKGROUND

An integrated circuit (IC) package typically includes a die wirebonded or soldered to a package substrate. In use, electrical signals and power are passed between the package substrate and the die through the wirebonds or solder.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
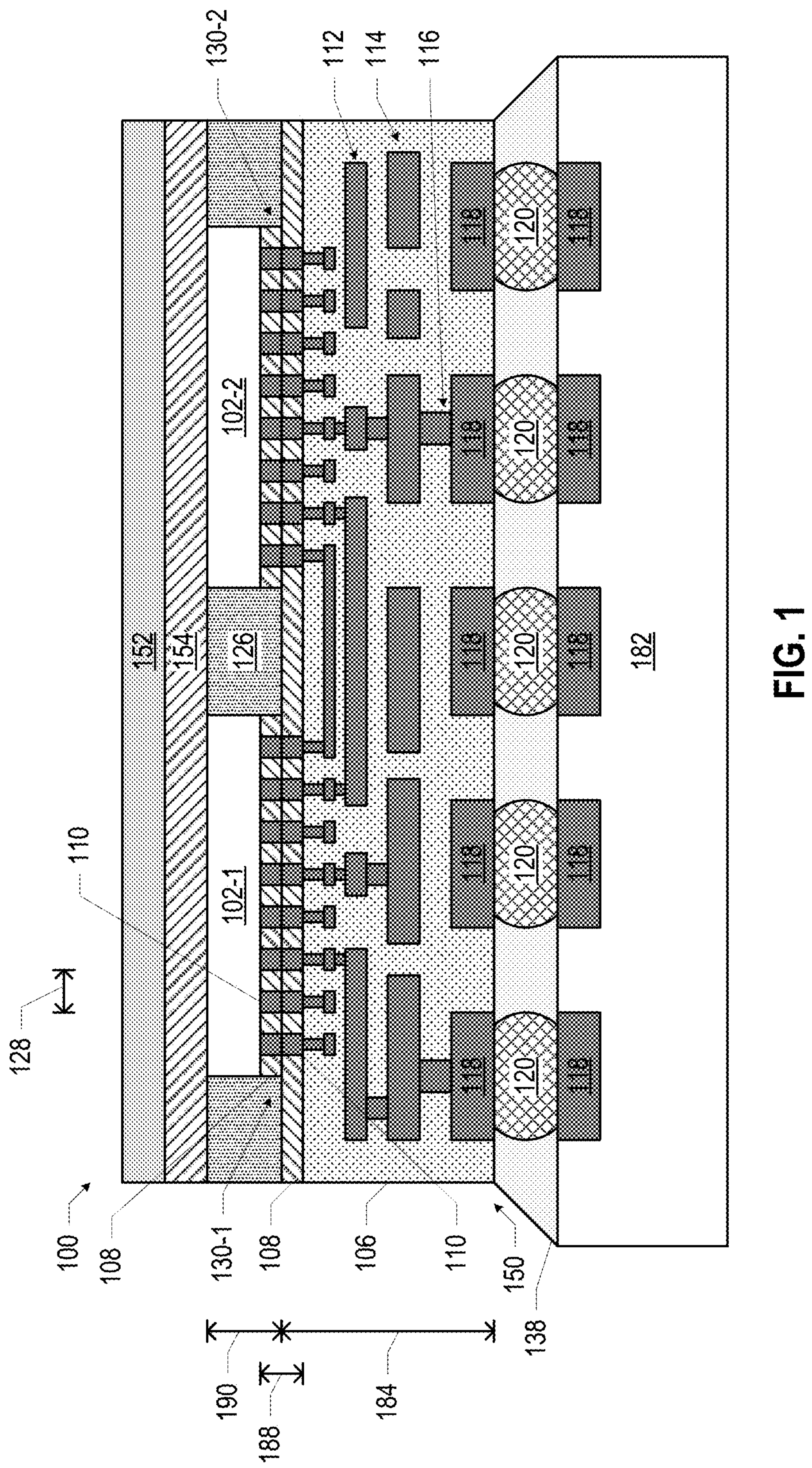
FIG. 1 is a side, cross-sectional view of an example microelectronic assembly with direct bonding, in accordance with various embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating microelectronic assemblies with direct bonding using NTC, proposed herein, it might be useful to first understand phenomena that may come into play in some microelectronic assemblies where direct bonding may be used. The following foundational information may be viewed as a basis from which the present disclosure may be properly explained. Such information is offered for purposes of explanation only and, accordingly, should not be construed in any way to limit the broad scope of the present disclosure and its potential applications.

Direct bonding has attracted considerable attraction recently for coupling microelectronic components (e.g., two dies, or a die and one of a package substrate, a circuit board, or an interposer). As used herein, the term "direct bonding" is used to include metal-to-metal bonding techniques (e.g., copper-to-copper bonding, or other techniques in which direct bonding contacts (DB contacts) of opposing direct bonding interfaces (DB interfaces) are brought into contact first, then subject to heat and compression) and hybrid bonding techniques (e.g., techniques in which direct bonding dielectric (DB dielectric) of opposing DB interfaces, possibly first subjected to prior surface activation, are brought into contact first, then subject to heat and sometimes compression, or techniques in which the DB contacts and the DB dielectric, possibly first subjected to prior surface activation, of opposing DB interfaces are brought into contact substantially simultaneously, and the subject to heat and sometimes compression). The materials of opposing DB dielectrics can be homogeneous (i.e., have substantially the same material composition) or non-homogeneous (i.e., have different material compositions). In such techniques, the DB contacts, and the DB dielectric at one DB interface (e.g., at a DB interface of a first microelectronic component) are brought into contact with the DB contacts and the DB dielectric at another DB interface (e.g., at a DB interface of a second microelectronic component), respectively, and elevated pressures and/or temperatures may be applied to cause the contacting DB contacts and/or the contacting DB dielectrics to bond.

Direct bonding may provide significant advantages over conventional coupling techniques such as solder-based interconnects or wirebonds. Direct bonding interconnects may be capable of reliably conducting a higher current than other types of interconnects; for example, some conventional solder interconnects may form large volumes of brittle intermetallic compounds when current flows, and the maximum current provided through such interconnects may be constrained to mitigate mechanical failure. However, there are also some challenges that limit realization of the full potential of direct bonding.

One challenge of direct bonding resides in selection of materials to be used as DB contacts and DB dielectrics.

Among the wide range of material choices available for DB dielectrics, materials that include silicon, carbon, nitrogen (e.g., in the form of silicon carbon nitride (SiCN) may be particularly advantageous. Carbon content in SiCN may play an instrumental role in the hydrophilic nature of the surface of the DB dielectric. SiCN with relatively high carbon content (e.g., greater than 22-25%) may possess the least contact angle among the prospective dielectrics due the highest dangling bond density. As a result, conversion of molecular bonds to covalent bonds can be achieved, advantageously, at a much lower post-bond annealing temperature than their counterparts. Usually, a temperature below about 200° C. will suffice. Post-bond annealing may serve two key purposes. One is conversion of dielectric molecular bonding to strong covalent bonds, and another one is copper-to-copper diffusion bonding when copper is used as a material for DB contacts. However, using conventional PCC, a reliable copper-to-copper joint is formed only at temperatures around 300° C. since diffusivity increases with temperature. Using FGC as DB contact may help to slightly reduce the copper-to-copper joint formation temperature. However, FGC plating typically involves use of large amount of additives and these additives hinder diffusion at the interface. Hence, the advantages of lower post-bond annealing temperatures provided by SiCN dielectrics can be only realized if reliable copper-to-copper joints can also be formed at temperatures of or below about 200° C. within 2-3 hours excluding ramp and cooling time periods. This is not currently feasible when PCC or FGC is used, but may be feasible when NTC is used as an alternative material of DB contacts.

As an alternative to PCC or FGC, NTC may be considered for low-temperature hybrid bond interconnects (HBI) due to having preferential <111> orientation of the grains, since copper diffusivity is about 1000 times higher in this orientation compared to other directions. Thus, the benefits of using SiCN as a DB dielectric with respect to low thermal budget bonding process flow may be realized when coupled with using NTC as a DB contact. Another advantage of NTC is its columnar microstructure, which is thermally stable and, hence, may help mitigate issues related to grain coarsening. Faster copper diffusivity in <111> direction and stable columnar microstructure make NTC a viable candidate for replacing PCC or FGC in direct bonding interconnects. Moreover, individual twins of NTC may advantageously act as grain boundary diffusion barriers and may help reduce or prevent void formation due to electromigration. However, one major challenge in the adaptation of NTC for direct bonding interconnects is retaining the columnar microstructure for deep copper damascene trenches currently used for DB contacts. Typically, current DB contacts are formed by providing openings (e.g., in the form of trenches) of between about 1 micron and 4 micron, and then depositing a DB contact material into the opening (e.g., using electroplating). Such deep openings for copper contacts are typically needed to ensure sufficient copper volume for expansion during annealing and to establish adequate contact with the mating pads. Unfortunately, when NTC is electroplated in openings having depth greater than about 300 nanometers, retaining columnar microstructure of NTC may not be possible, severely impacting copper diffusivity and rendering the advantages of using NTC as an alternative to PCC or FGC non-existent or significantly compromised.

Disclosed herein are microelectronic assemblies with direct bonding using NTC, as well as related structures and techniques. Embodiments of the present disclosure are based on recognition that a DB contact of a given microelectronic component (e.g., a die, a package substrate, a circuit board, an interposer, etc.) that is to be coupled to another microelectronic component may include two portions with electrically conductive materials of different microstructures. A first portion may be a bulk portion of the DB contact and may include a first electrically conductive material, while a second portion is a cap portion of the DB contact (i.e., a portion at the surface of the DB contact before that DB contact is bonded with a corresponding contact of the other microelectronic component) and may include a second electrically conductive material. Such a DB contact may be formed by, first, depositing the first electrically conductive material into an opening for a DB contact. Deposition of the first electrically conductive material may followed by planarization (i.e., a process in which an overburden of a material is removed, one example of such a process being chemical mechanical polishing (CMP)) so that a surface of the electrically conductive material may be aligned with the top of the opening and, afterwards, providing a recess of the first electrically conductive material so that the surface of the first electrically conductive material is below the top of the opening. The second electrically conductive material is then deposited to fill the recess. The depth of the recess in the first electrically conductive material, i.e., a thickness of the second portion of the DB contact, may be less than about 300 nanometers, while a thickness of the first portion of the DB contact may be at least about 500 nanometers, e.g., at least about 700-3500 nanometers. The first electrically conductive material may include PCC and/or FGC, while the second electrically conductive material may include NTC. Because NTC is only deposited as a cap layer, i.e., deposited into a recess opening that is less than about 300 nanometers deep, it is possible to advantageously preserve its columnar structure and faster copper diffusivity in <111> direction for the DB interface, compared to trying to deposit NTC into the entirety of an opening for a DB contact. The bulk of the opening for a DB contact may be filled with PCC, FGC, or another electrically conductive material that may not have the columnar structure and faster copper diffusivity in <111> direction that NTC has, which is acceptable because the electrically conductive material in this portion is below the DB interface. Such DB contacts may be of any architecture/geometry, such as pads, through-semiconductor vias (TSVs), nano-RSVs, pillars, etc., and may, therefore, facilitate wide scale adaptation of NTC irrespective of aspect ration of a DB contact.

The difference in microstructures of the first electrically conductive material such as PCC or FGC in the bulk of the opening for a DB contact and the second electrically conductive material such as NTC of the cap of the opening can be clearly distinguished since NTC possesses unique columnar microstructure. Any suitable microstructure characterization technique may be used for this purpose. Grain orientation determined using electron backscatter diffraction (EBSD) or another suitable characterization technique may provide another means to distinguish between first and second electrically conductive materials, since PCC or FGC will possess substantially random grain orientation, while NTC will have a preferred <111> orientation.

As an example of microelectronic assemblies with direct bonding using NTC, in some embodiments, a microelectronic assembly may include a first microelectronic component and a second microelectronic component coupled to the first microelectronic component by a DB region, wherein the DB region includes a DB contact comprising a first portion and a second portion having different microstructures, the second portion comprising NTC. The first portion is between the first microelectronic component and the second portion. The second portion is between the first portion and the second microelectronic component. In some embodiments, the first portion has non-columnar microstructure, while the second portion has columnar microstructure of NTC. In some embodiments, less than about 40% of grains of the first portion have a <111> orientation, and at least about 50% of grains of the second portion have the <111> orientation. In some embodiments, the first portion includes PCC or FGC.

In some embodiments, two-layer DB contacts as described herein may, advantageously, be combined with a DB dielectric also having two portions with dielectric materials having different material compositions. A first portion of the DB dielectric may be a bulk portion of the DB dielectric and may include a dielectric material having either substantially no carbon or having atomic percentage of carbon less than about 25%, while a second portion of the DB dielectric may be a cap portion of the DB dielectric (i.e., a portion at the surface of the DB dielectric before that DB dielectric is bonded with a corresponding dielectric of the other microelectronic component) and may include a second dielectric material having more carbon than the first dielectric material, e.g., a material with an atomic percentage of carbon being at least 25%. Having a dielectric material with more carbon at a DB interface may be advantageous in terms of having more of a hydrophilic nature and the least contact angle, suitable for fusion bonding, while having a dielectric material with less carbon in the bulk of the DB dielectric, away from the DB interface, may be advantageous in terms of improved moisture resistance and diffusion barrier properties compared to dielectric materials with more carbon.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Any of the features discussed with reference to any of accompanying drawings herein may be combined with any other features to form a microelectronic assembly 100 with direct bonding using NTC, as appropriate. A number of elements of the drawings are shared with others of the drawings; for ease of discussion, a description of these elements is not repeated, and these elements may take the form of any of the embodiments disclosed herein. Also for convenience, the phrase "microelectronic components 102" may be used to refer to the collection of microelectronic components 102-1, 102-2, and so on, the phrase "DB region 130" may be used to refer to the collection of DB regions 130-1, 130-2, and so on, etc. To not clutter the drawings, if multiple instances of certain elements are illustrated, only some of the elements may be labeled with a reference sign. The drawings are not necessarily to scale. Although many of the drawings illustrate rectilinear structures with flat walls and right-angle corners, this is simply for ease of illustration and may not reflect real-life process limitations which may cause various features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of direct bonding using NTC as described herein.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used to describe a range of dimensions, the phrase "between X and Y" represents a range that includes X and Y. When used to describe a location of an element, the phrase "between X and Y" represents a region that is spatially between element X and element Y. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−20%, e.g., within +/−5% or within +/−2%, of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, the terms "package" and "IC package" are synonymous, as are the terms "die" and "IC die." Furthermore, the terms "chip," "chiplet," "die," and "IC die" may be used interchangeably herein.

Although certain elements may be referred to in the singular herein, such elements may include multiple sub-elements. For example, "a dielectric material" may include one or more dielectric materials. The terms "oxide," "carbide," "nitride," etc. refer to compounds containing, respectively, oxygen, carbon, nitrogen, etc. The term "high-k dielectric" refers to a material having a higher dielectric constant than silicon oxide, while the term "low-k dielectric" refers to a material having a lower dielectric constant than silicon oxide. The term "insulating" and variations thereof (e.g., "insulative" or "insulator") means "electrically insulating," the term "conducting" and variations thereof (e.g., "conductive" or "conductor") means "electrically conducting," unless otherwise specified. With reference to optical signals and/or devices, components and elements that operate on or using optical signals, the term "conducting" can also mean "optically conducting." The term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components. The term "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., printed circuit board (PCB) or Printed Wiring Boards (PWB)), glass, ceramic, silicon, silicon carbide, etc. In addition, as used herein, a package substrate may refer to a substrate that includes buildup layers (e.g., Ajinomoto Buildup Film (ABF) layers). In some embodiments, a package substrate may be a PCB or a multilayer package substrate that includes a core including glass, e.g., a core including a glass layer, where the glass layer may be bulk glass or a solid volume of glass, as opposed to, e.g., glass fiber reinforced polymers (i.e., in some embodiments, the glass layer does not include any glass fiber reinforced polymers).

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "metallization stack" may be used to refer to a stack of one or more interconnects for providing connectivity to different circuit components of an IC die/chip and/or a package substrate. The term "conductive trace" may be used to describe an electrically conductive element isolated by an insulating material. Within IC dies, such insulating material comprises interlayer low-k dielectric that is provided within the IC die. Within package substrates, and PCBs such insulating material may comprise organic materials such as ABF, polyimides, or epoxy resin. Such conductive lines are typically arranged in several levels, or several layers, of metallization stacks. The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

Figure 2:
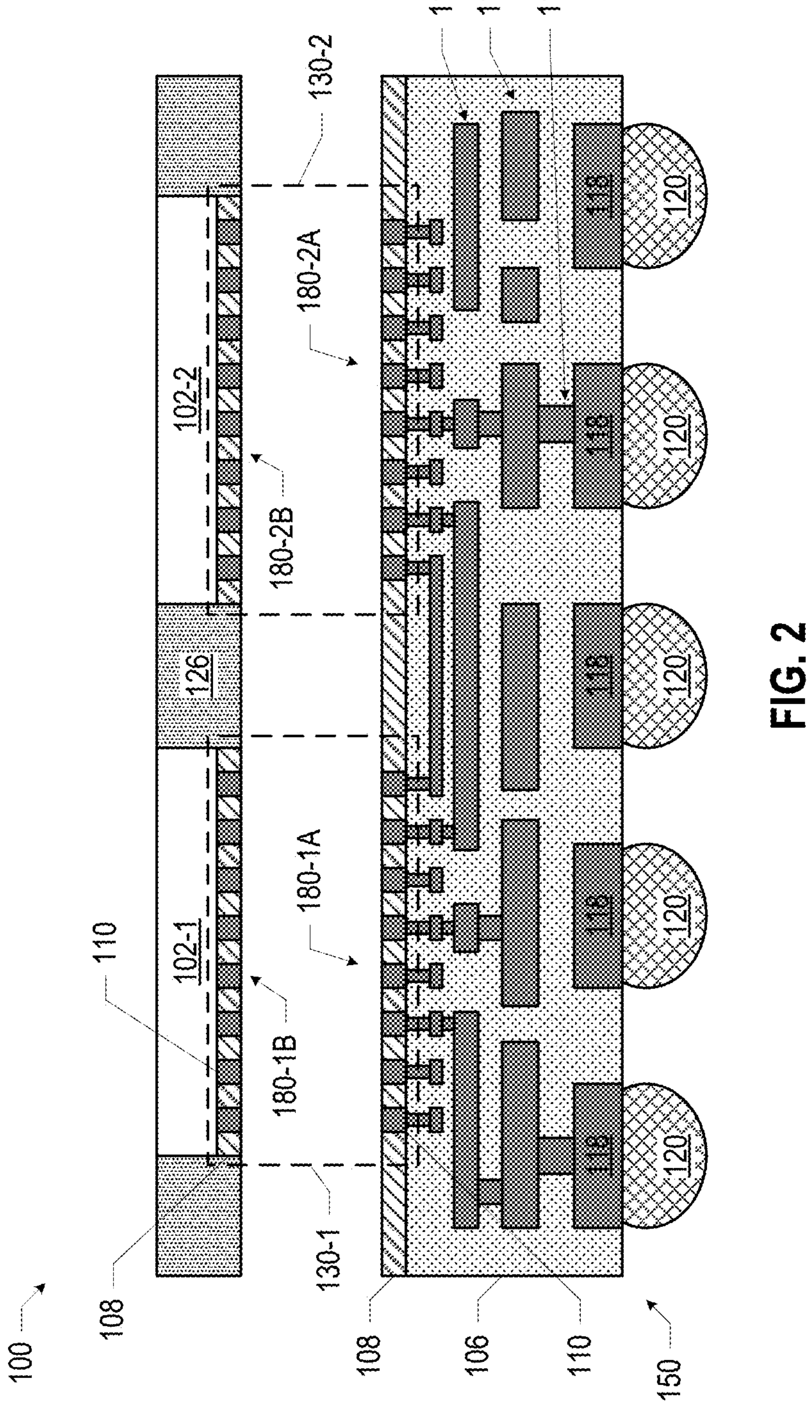
FIG. 2 is a side, cross-sectional exploded view of a portion of the microelectronic assembly of FIG. 1, in accordance with various embodiments.
Figure 21:
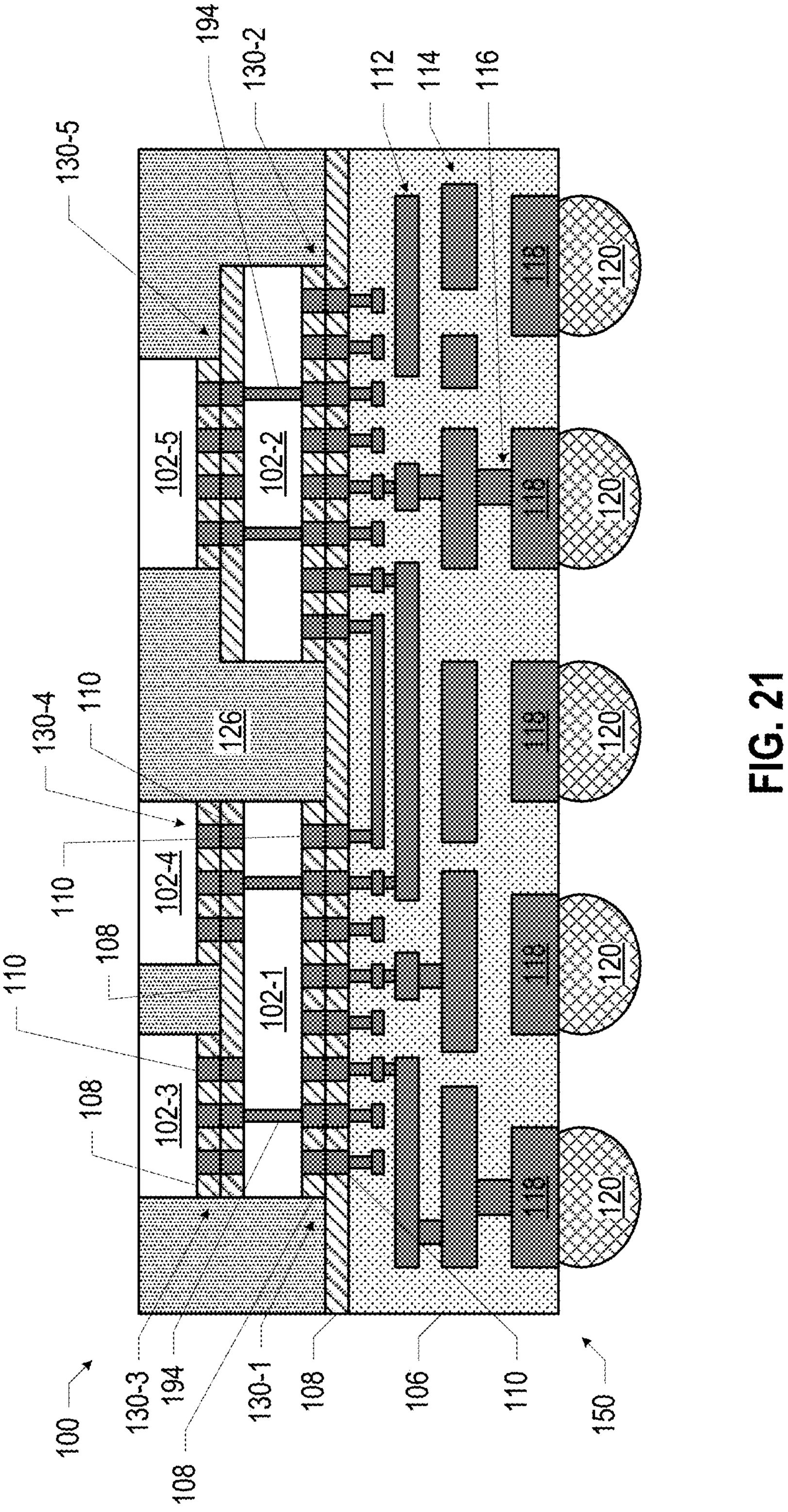

FIG. 1 is a side, cross-sectional view of a microelectronic assembly 100, in accordance with various embodiments. The microelectronic assembly 100 may include an interposer 150 coupled to a microelectronic component 102-1 by a DB region 130-1. A number of elements are illustrated in FIG. 1 as included in the microelectronic assembly 100, but a number of these elements may not be present in a microelectronic assembly 100. For example, in various embodiments, the heat transfer structure 152, the thermal interface material (TIM) 154, the mold material 126, the microelectronic component 102-2, the underfill material 138, and/or the support component 182 may not be included. In another example, in some embodiments, the microelectronic component 102-1 of the microelectronic assembly 100 may be coupled to another microelectronic component 102 by a DB region 130 (e.g., as shown in FIG. 21), but the interposer 150 of FIG. 1, and the associated DB region 130-1 coupling the microelectronic component 102-1 to the interposer 150 may not be included. In such embodiments, descriptions of portions of the DB regions 130 provided for the interposer 150, such as descriptions of the DB interfaces 180 or DB contacts 110 of the interposer 150 provided with reference to FIG. 2, are applicable to DB regions 130 between two microelectronic components 102. Phrased differently, the interposer 150 may be one example of a microelectronic component 102 to which another microelectronic component 102 is bonded by direct bonding, with other examples including a package substrate, a circuit board, or a die. Further, FIG. 1 illustrates a number of elements that are omitted from subsequent drawings for ease of illustration, but may be included in any of the microelectronic assemblies 100 disclosed herein. Examples of such elements include the heat transfer structure 152, the TIM 154, the mold material 126, the microelectronic component 102-2, the underfill material 138, and/or the support component 182. Many of the elements of the microelectronic assembly 100 of FIG. 1 are included in other ones of the accompanying drawings; the discussion of these elements is not repeated when discussing these drawings, and any of these elements may take any of the forms disclosed herein. In some embodiments, individual ones of the microelectronic assemblies 100 disclosed herein may serve as a system-inpackage (SiP) in which multiple microelectronic components 102 having different functionality are included. In such embodiments, the microelectronic assembly 100 may be referred to as an SiP.

As illustrated in FIG. 2, the DB region 130-1 may include a DB interface 180-1A at the top surface of the interposer 150, with the DB interface 180-1A including a set of conductive DB contacts 110 and a DB dielectric 108 around the DB contacts 110 of the DB interface 180-1A. The DB region 130-1 may also include a DB interface 180-1B at the bottom surface of the microelectronic component 102-1, with the DB interface 180-1B including a set of DB contacts 110 and a DB dielectric 108 around the DB contacts 110 of the DB interface 180-1B. The DB contacts 110 of the DB interface 180-1A of the interposer 150 may substantially align with the DB contacts 110 of the DB interface 180-1B of the microelectronic component 102-1 so that, in the microelectronic assembly 100, the DB contacts 110 of the microelectronic component 102-1 are in contact with the DB contacts 110 of the interposer 150. In the microelectronic assembly 100 of FIG. 1, the DB interface 180-1A of the interposer 150 may be bonded (e.g., electrically and mechanically) with the DB interface 180-1B of the microelectronic component 102-1 to form the DB region 130-1 coupling the interposer 150 and the microelectronic component 102-1, as discussed further below. More generally, the DB regions 130 disclosed herein may include two complementary DB interfaces 180 bonded together; for ease of illustration, many of the subsequent drawings may omit the identification of the DB interfaces 180 to improve the clarity of the drawings.

As described above, the term "direct bonding" is used to include metal-to-metal bonding techniques such as copper-to-copper bonding, or other techniques in which the DB contacts 110 of opposing DB interfaces 180 are brought into contact first, then subject to heat and compression. The term is also used to include hybrid bonding techniques such as techniques in which the DB dielectric 108 of opposing DB interfaces 180, possibly first subjected to prior surface activation, are brought into contact and then subjected to heat and sometimes compression, or techniques in which the DB contacts 110 and the DB dielectric 108 of opposing DB interfaces 180, possibly first subjected to prior surface activation, are brought into contact substantially simultaneously, then subject to heat and sometimes compression. In all such techniques, the DB contacts 110 and the DB dielectric 108 at one DB interface 180 are brought into contact with, respectively, the DB contacts 110 and the DB dielectric 108 at another DB interface 180, and elevated pressures and/or temperatures may be applied to cause the contacting DB contacts 110 and/or the contacting DB dielectrics 108 to bond. In some embodiments, this bond may be achieved without the use of intervening solder or an anisotropic conductive material, while in some other embodiments, a thin cap of solder may be used in a DB interconnect to accommodate planarity, and this solder may become an intermetallic compound in the DB region 130 during processing.

A DB dielectric 108 may include one or more dielectric materials, such as one or more inorganic dielectric materials. For example, a DB dielectric 108 may include silicon, carbon, and nitrogen (e.g., in the form of silicon carbon nitride); silicon and nitrogen (e.g., in the form of silicon nitride); silicon and oxygen (e.g., in the form of silicon oxide); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof. Some particular embodiments of arrangements of DB dielectrics 108 including multiple layers of dielectric materials are discussed below with reference to FIG. 4, e.g., embodiments where a layer of a DB dielectric 108 closest to a bonding surface of the DB interface 180 has higher carbon content than other layers of the DB dielectric 108.

A DB contact 110 may include a pillar, a pad, or other structure. The DB contacts 110, although depicted in the accompanying drawings in the same manner at both DB interfaces 180 of a DB region 130, may have a same structure at both DB interfaces 180, or the DB contacts 110 at different DB interfaces 180 may have different structures. For example, in some embodiments, a DB contact 110 in one DB interface 180 may include a metal pillar (e.g., a copper pillar), and a complementary DB contact 110 in a complementary DB interface 180 may include a metal pad (e.g., a copper pad) recessed in a dielectric. A DB contact 110 may include multiple layers of electrically conductive materials where a layer of a DB contact 110 closest to the bonding surface of the DB interface 180 has NTC, while other layers (i.e., layers of a DB contact 110 that are not at the DB interface 180) may include any one or more conductive materials, such as copper (e.g., PCC or FGC), manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). Details of multiple materials in a DB contact 110 are discussed below with reference to FIG. 3. In some embodiments, the DB dielectric 108 and the DB contacts 110 of a DB interface 180 may be manufactured using low-temperature deposition techniques (e.g., techniques in which deposition occurs at temperatures below 250 degrees Celsius, or below 200 degrees Celsius), such as low-temperature plasma-enhanced chemical vapor deposition (PECVD).

FIGS. 1 and 2 also illustrate a microelectronic component 102-2 coupled to the interposer 150 by a DB region 130-2 (via the DB interfaces 180-2A and 180-2B, as shown in FIG. 2). Although FIG. 1 depicts a particular number of microelectronic components 102 coupled to the interposer 150 by DB regions 130, this number and arrangement are simply illustrative. In various embodiments, a microelectronic assembly 100 may include any desired number and arrangement of microelectronic components 102 coupled to an interposer 150 by DB regions 130, or a microelectronic assembly 100 may include any desired number and arrangement of one or more microelectronic components 102 coupled to one or more other microelectronic components 102 by DB regions 130. Although a single reference numeral "108" is used to refer to the DB dielectrics of multiple different DB interfaces 180 (and different DB regions 130), this is simply for ease of illustration, and the DB dielectric 108 of different DB interfaces 180 (even within a single DB region 130) may have different materials and/or structures (e.g., in accordance with any of the embodiments discussed below with reference to FIG. 3). Similarly, although a single reference numeral "110" is used to refer to the DB contacts of multiple different DB interfaces 180 (and different DB regions 130), this is simply for ease of illustration, and one or more of the DB contacts 110 described herein may have multiple layers of electrically conductive materials where a layer of a DB contact 110 closest to the bonding surface of the DB interface 180 includes NTC, while other layers (i.e., layers of a DB contact 110 that are not at the DB interface 180) include electrically conductive materials with different microstructure. Furthermore, the DB contacts 110 of different DB interfaces 180 (even within a single DB region 130) may have different materials and/or structures (e.g., in accordance with any of the embodiments discussed below with reference to FIG. 4).

The interposer 150 may include an insulating material 106 (e.g., one or more dielectric materials formed in multiple layers, as known in the art) and one or more conductive pathways 112 through the insulating material 106 (e.g., including lines 114 and/or vias 116, as shown). In some embodiments, the insulating material 106 of the interposer 150 may be an organic material, such as polyimide or polybenzoxazole, or may include an organic polymer matrix (e.g., epoxide) with a filler material (that may be inorganic). In some such embodiments, the interposer 150 may be referred to as an "organic interposer." In some embodiments, the insulating material 106 of an interposer 150 may be provided in multiple layers of organic buildup film. Organic interposers 150 may be less expensive to manufacture than semiconductor- or glass-based interposers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that constrain semiconductor- or glass-based interposers, allowing for the use of design features such as non-Manhattan routing (e.g., not being restricted to using one layer for horizontal interconnects and another layer for vertical interconnects) and the avoidance of TSVs such as through-silicon vias or through-glass vias (which may be limited in the achievable pitch, and may result in less desirable power delivery and signaling performance). Conventional IC packages including an organic interposer have been limited to solder-based attach technologies, which may have a lower limit on the achievable pitch that precludes the use of conventional solder-based interconnects to achieve the fine pitches desired for next generation devices. Utilizing an organic interposer 150 in a microelectronic assembly 100 with direct bonding, as disclosed herein, may leverage these advantages of organic interposers in combination with the ultra-fine pitch (e.g., the pitch 128 discussed below) achievable by direct bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the interposer 150 is formed using standard PCB processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the DB contacts 110) and a conductive contact 118 at the bottom surface of the interposer 150. In some embodiments, one or more of the conductive pathways 112 in the interposer 150 may extend between different conductive contacts at the top surface of the interposer 150 (e.g., between different DB contacts 110 potentially in different DB regions 130, as discussed further below). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors.

Although FIGS. 1 and 2 (and others of the accompanying drawings) illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example. Examples of some particular arrangements of liners 132 that may be part of conductive pathways 112 are discussed below with reference to FIGS. 9 and 10.

In some embodiments, a microelectronic component 102 may include an IC die (packaged or unpackaged) or a stack of IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imagable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 33. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed to/from a microelectronic component 102 through a DB region 130 (e.g., routed through the interposer 150 and/or routed to/from other microelectronic components 102). In some embodiments, a microelectronic component 102 may take the form of any of the embodiments of the interposer 150 herein. Conversely, in some embodiments, the interposer 150 shown in FIG. 1, or portions thereof, may be another microelectronic component 102 or portions of another microelectronic component 102. Although the microelectronic components 102 of the microelectronic assembly 100 of FIG. 1 are single-sided components (in the sense that an individual microelectronic component 102 only has conductive contacts (e.g., DB contacts 110) on a single surface of the individual microelectronic component 102), in some embodiments, a microelectronic component 102 may be a double-sided (or "multi-level," or "omni-directional") component with conductive contacts on multiple surfaces of the component. Some particular examples of double-sided microelectronic components 102 are discussed below, e.g., with reference to FIG. 21.

Additional components (not shown), such as surface-mount resistors, capacitors, and/or inductors, may be disposed on the top surface or the bottom surface of the interposer 150, or embedded in the interposer 150. The microelectronic assembly 100 of FIG. 1 also includes a support component 182 coupled to the interposer 150. In the particular embodiment of FIG. 1, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual-damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 1 may also include a mold material 126. The mold material 126 may extend around one or more of the microelectronic components 102 on the interposer 150. In some embodiments, the mold material 126 may extend between multiple microelectronic components 102 on the interposer 150 and around the DB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 1 may also include a TIM 154. The TIM 154 may include a thermally conductive material (e.g., metal particles) in a polymer or other binder. The TIM 154 may be a thermal interface material paste or a thermally conductive epoxy (which may be a fluid when applied and may harden upon curing, as known in the art). The TIM 154 may provide a path for heat generated by the microelectronic components 102 to readily flow to the heat transfer structure 152, where it may be spread and/or dissipated. Some embodiments of the microelectronic assembly 100 of FIG. 1 may include a sputtered metallization (not shown) across the top surfaces of the mold material 126 and the microelectronic components 102; the TIM 154 (e.g., a solder TIM) may be disposed on this metallization.

The microelectronic assembly 100 of FIG. 1 may also include a heat transfer structure 152. The heat transfer structure 152 may be used to move heat away from one or more of the microelectronic components 102 (e.g., so that the heat may be more readily dissipated). The heat transfer structure 152 may include any suitable thermally conductive material (e.g., metal, appropriate ceramics, etc.), and may include any suitable features (e.g., a heat spreader, a heat sink including fins, a cold plate, etc.). In some embodiments, a heat transfer structure 152 may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a DB region 130 may be between 50 nanometers and 8 microns, e.g., between 100 nanometers and 6 microns or between 100 nanometers and 5 microns. Because the thickness 188 includes a DB dielectric 108 and DB contacts 110 on each of the two sides of DB interfaces 180 being bonded, this means that a thickness of the DB dielectric 108 for each of the sides being bonded, and, correspondingly, a height of the DB contacts 110, may be about half of the thickness 188. In some embodiments, a thickness 190 of a microelectronic component 102 may be between 5 microns and 800 microns. In some embodiments, a pitch 128 of the DB contacts 110 in a DB region 130 may be less than 20 microns (e.g., between 0.1 microns and 20 microns).

Figures 3, 4, 5, 6, 7, 8:
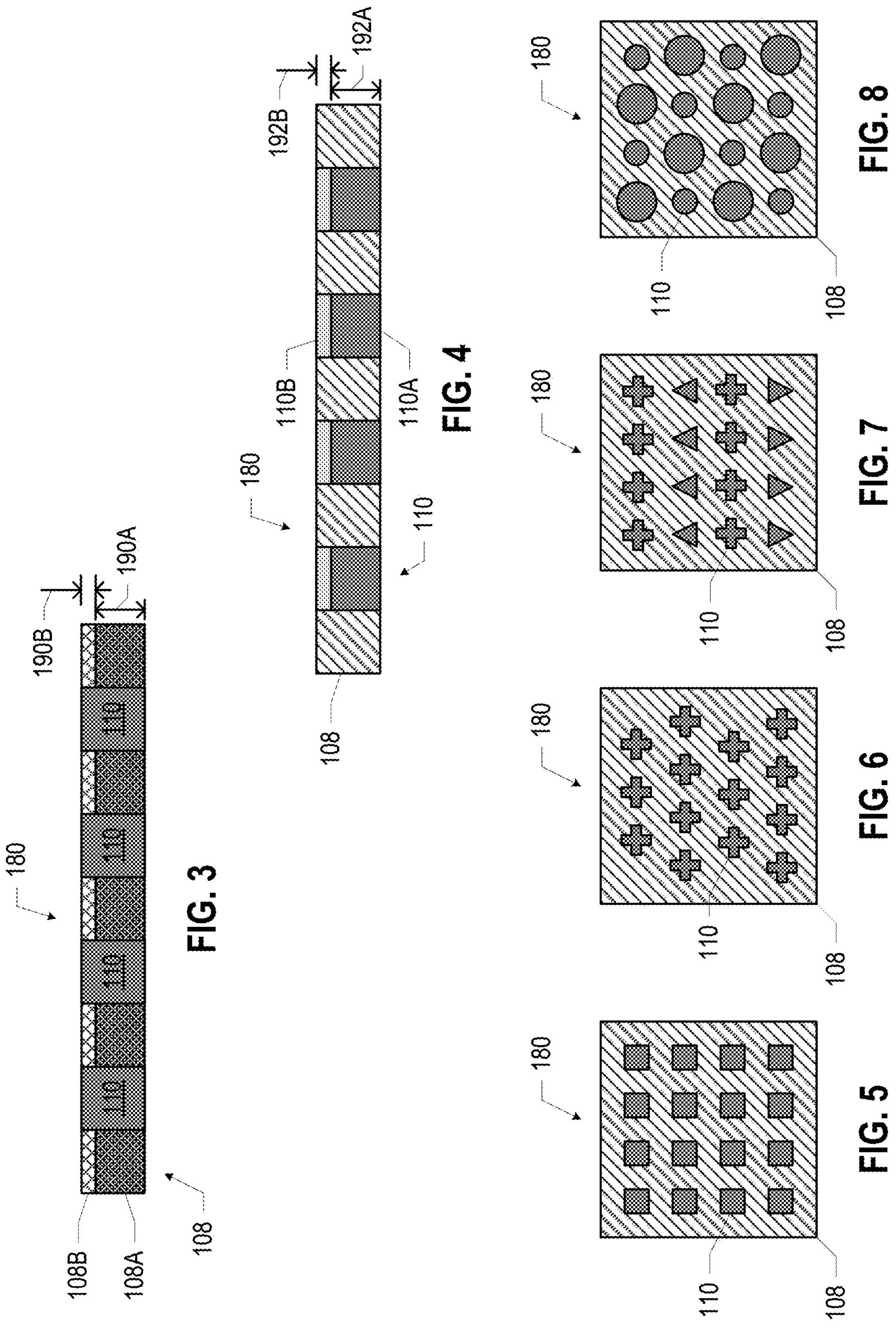
FIGS. 3 and 4 are side, cross-sectional views of example direct bonding interfaces, in accordance with various embodiments.
FIGS. 5-8 are top views of example direct bonding interfaces, in accordance with various embodiments.
Figure 9:
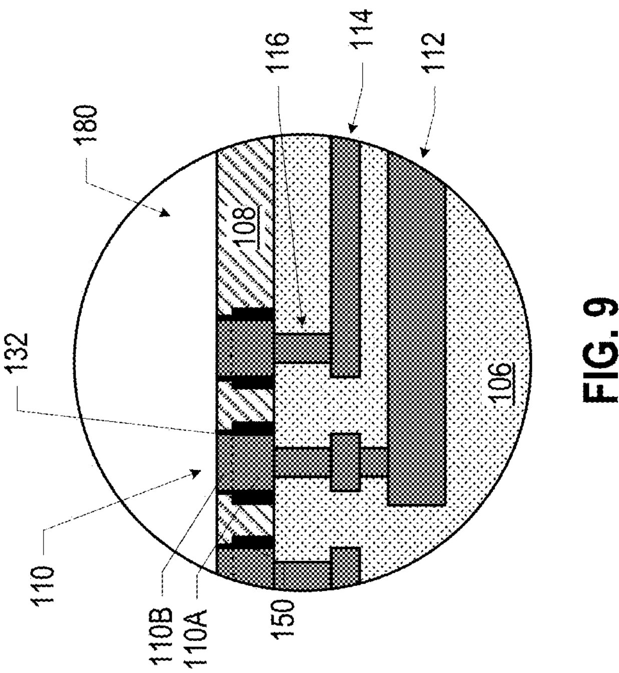

FIGS. 3-29 illustrate additional example microelectronic assemblies 100 and components thereof. Any of the features discussed with reference to any of FIGS. 3-29 herein may be combined with any other features to form a microelectronic assembly 100 or component thereof. For example, as discussed further below, FIG. 4 illustrates an embodiment of a DB interface 180 in which a DB contact 110 includes multiple different material portions, and FIG. 9 illustrates an embodiment of a DB interface 180 in which a liner 132 is present between a DB contact 110 and the adjacent DB dielectric 108. These features of FIGS. 4 and 9 may be combined so that a DB interface 180, in accordance with the present disclosure, has DB contacts 110 with multiple different material portions and a liner 132 between DB contacts 110 and adjacent DB dielectric 108. In another example, as discussed further below, FIG. 3 illustrates an embodiment of a DB interface 180 in which a DB dielectric 108 includes multiple different material portions. This feature of FIG. 3 may be combined with the features of FIGS. 4 and 9 of the first example so that a DB interface 180, in accordance with the present disclosure, has DB dielectrics 108 with multiple different material portions, DB contacts 110 with multiple different material portions and a liner 132 between DB contacts 110 and adjacent DB dielectric 108. These particular combinations are simply examples, and any combination may be used.

As noted above, a DB dielectric 108 may include one or more materials arranged in any desired manner. For example, FIG. 3 illustrates a DB interface 180 (which may be part of an interposer 150 or a microelectronic component 102) that includes DB dielectric 108 around DB contacts 110. In the particular embodiment of FIG. 3, the DB dielectric 108 may include a first portion 108A and a second portion 108B, the second portion 108B being between the first portion 108A and the bonding surface of the DB interface 180. The first portion 108A and the second portion 108B may have different material compositions. For example, in some embodiments, the first portion 108A may include silicon and oxygen (e.g., in the form of silicon oxide), and the second portion 108B may include silicon, carbon, and nitrogen (e.g., in the form of silicon carbonitride) or the second portion 108B may include silicon, oxygen, carbon, and nitrogen (e.g., in the form of silicon oxycarbonitride). In another example, in some embodiments, the first portion 108A may include any suitable dielectric material having an atomic percentage of carbon lower than that of the dielectric material of the second portion 108B. For example, each of the first portion 108A and the second portion 108B may include silicon, carbon, and nitrogen (e.g., in the form of silicon carbonitride) or include silicon, oxygen, carbon, and nitrogen (e.g., in the form of silicon oxycarbonitride), but with different amounts of carbon present. Alternatively, the first portion 108A may not include any substantial amounts of carbon present beyond unintentional impurity amounts, e.g., below about 5% or below about 1%, while the second portion 108B may include silicon, carbon, and nitrogen (e.g., in the form of silicon carbonitride) or include silicon, oxygen, carbon, and nitrogen (e.g., in the form of silicon oxycarbonitride). In some embodiments, the atomic percentage of carbon in the first portion 108A may be below about 25%, e.g., below about 22%, e.g., between about 0-25%, while the atomic percentage of carbon in the second portion 108B may be above 25%, e.g., between about 25-45% or between about 25-35%. Having a material with higher carbon concentration as a dielectric material that is closest to the bonding surface of a DB interface 180 (i.e., the material in the second portion 108B) may be advantageous in terms of the ability to convert molecular bonds to covalent bonds at relatively low post-bond annealing temperatures. Having a material with lower carbon concentration as a dielectric material that is further away from the bonding surface of a DB interface 180 (i.e., the material in the first portion 108A) may be advantageous in terms of improved moisture resistance and diffusion barrier properties. The thickness 190A of the first portion 108A may be greater than the thickness 190B of the second portion 108B. For example, in some embodiments, the thickness 190B may be greater than zero but less than about 500 nanometers (e.g., less than about 300 nanometers, less than about 100 nanometers, less than about 50 nanometers, or less than about 30 nanometers), while the thickness 190A may be greater than about 50 nanometers (e.g., greater than about 300 nanometers, e.g., between 50 nanometers and 5 microns). When the thickness 190A is greater than the thickness 190B, the first portion 108A may be referred to as a "bulk" material and the second portion 108B may be referred to as an "interface" material or a "cap" material of the DB dielectric 108. Although FIG. 3 illustrates an embodiment in which the DB dielectric 108 includes two portions, a DB dielectric 108 may include more than two portions (e.g., arranged in layers parallel to the bonding surface of the DB interface 180).

Figures 30, 31:
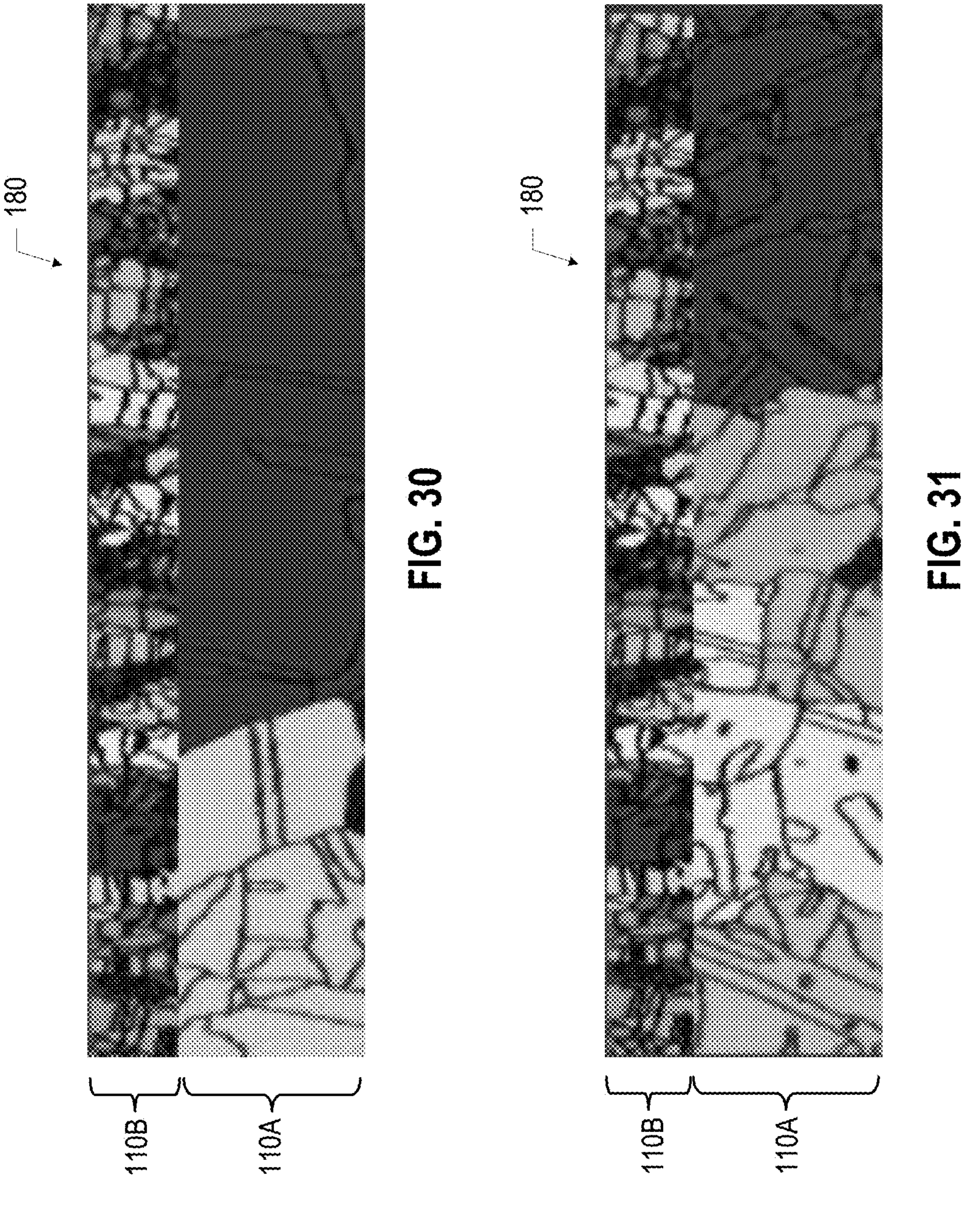
FIG. 30 is a side, cross-sectional view of example microstructures of NTC and polycrystalline copper (PCC), in accordance with various embodiments.
FIG. 31 is a side, cross-sectional view of example microstructures of NTC and fine-grain copper (FGC), in accordance with various embodiments.

As also noted above, a DB contact 110 includes at least two layers of materials with different microstructures, where the layer closest to the bonding surface of the DB interface 180 includes NTC and other one or more layers may include one or more materials arranged in any desired manner but having different microstructure as NTC. For example, FIG. 4 illustrates a DB interface 180 (which may be part of an interposer 150 or a microelectronic component 102) that includes DB dielectric 108 around DB contacts 110, where the DB contacts 110 include a first portion 110A and a second portion 110B, the second portion 110B being between the first portion 110A and the bonding surface of the DB interface 180. The first portion 110A and the second portion 110B have electrically conductive materials of different microstructures. For example, in some embodiments, the first portion 110A may include PCC or FGC, and the second portion 110B may include NTC. In some embodiments, the second portion 110B may have a columnar microstructure (i.e., the second portion 110B may have grains having a columnar shape, where a majority of the columnar grains have a preferred orientation), while the first portion 110A may have a non-columnar microstructure (i.e., the first portion 110A may have grains that do not have a preferred orientation). Having a material such as NTC that has a columnar microstructure as an electrically conductive material that is closest to the bonding surface of a DB interface 180 (i.e., the material in the second portion 110B) may be advantageous in terms of mitigating issues related to grain coarsening. Different microstructures of NTC compared to PCC or FGC would be clearly visible from images of EBSD or other characterization techniques, as is illustrated with FIG. 30, showing an example of the second portion 110B comprising NTC and the second portion 110A comprising PCC, or as is illustrated with FIG. 31, showing an example of the second portion 110B comprising NTC and the second portion 110A comprising FGC. FIGS. 30 and 31 illustrate that NTC has a columnar microstructure in that the grains have a columnar shape (i.e., the length of the grains is greater than the width of the grains) where different columnar grains are substantially oriented along one direction, while the grains of PCC or FGC do not have a columnar shape (i.e., on average, their length is about the same as their widths) and are not oriented along any particular direction.

The thickness 192A of the first portion 110A may be greater than the thickness 192B of the second portion 110B. For example, in some embodiments, the thickness 192B may be above zero but less than about 500 nanometers (e.g., less than about 300 nanometers, or less than about 200 nanometers), while the thickness 192A may be greater than about 50 nanometers (e.g., greater than about 400 nm, e.g., between 400 nanometers and 5 microns). Having a material such as NTC that has a columnar microstructure and preferential <111> orientation as an electrically conductive material that is closest to the bonding surface of a DB interface 180, but does not extend through the entire depth of the DB contact 110 (i.e., the material is confined only to the second portion 110B) may be advantageous in terms of retaining the columnar microstructure and relatively high copper diffusivity compared to thicker layers of such a material. When the thickness 192A is greater than the thickness 192B, the first portion 110A may be referred to as a "bulk" material and the second portion 110B may be referred to as an "interface" material or a "cap" material of the DB contacts 110. Although FIG. 4 illustrates an embodiment in which the DB contacts 110 include two portions, a DB contact 110 may include more than two portions (e.g., arranged in layers parallel to the bonding surface of the DB interface 180). In some embodiments, a DB interface 180 may include a DB dielectric 108 with multiple portions (e.g., as described with reference to FIG. 3) and a DB contact 110 with multiple portions.

In some embodiments, microstructures of the first portion 110A and the second portion 110B may be different in terms of different crystallographic orientations of their grains. For example, in some embodiments, at least about 50% of grains of the second portion 110B may have a <111> orientation, which may be characteristic of NTC (e.g., at least about 55%, at least about 60%, e.g., between about 50% and 95%). Having a material such as NTC that has majority of grains with <111> orientation as an electrically conductive material that is closest to the bonding surface of a DB interface 180 (i.e., the material in the second portion 110B) may be advantageous in terms of faster copper diffusivity in <111> direction. In some embodiments, less than about 40% of the first portion 110A may have a <111> orientation, which may be characteristic of PCC or FGC although the first portion 110A may include electrically conductive materials other than copper in some embodiments (e.g., less than about 35%, e.g., between about 30% and 35%). In some embodiments, grains of the first portion 110A may have a substantially random orientation (e.g., grains of the first portion 110A may have about equal distribution of different crystallographic orientations, such as <111>, <101>, and <001> orientations), which may also be characteristic of materials such as PCC or FGC and drastically different from materials such as NTC.

In some embodiments, microstructures of the first portion 110A and the second portion 110B may be different in terms of different average dimensions of their grains. For example, in some embodiments, an average grain dimension of grains in the first portion 110A may be at least about 2.5 micron (e.g., at least about 3 micron, between about 3 and 6 micron, or between about 5 and 6 micron), which may be characteristic of PCC. In some embodiments, an average grain dimension of grains in the first portion 110A may be less than about 3 micron (e.g., less than about 2.5 micron, between about 1 and 3 micron, or between about 2 and 3 micron), which may be characteristic of FGC. In some embodiments, an average grain length (i.e., the longest dimension) of grains in the second portion 110B may be at least about 1 micron (e.g., between about 1 and 3 micron or between about 1 and 2 micron), while an average grain width (i.e., a dimension perpendicular to the length), may be smaller than the length, e.g., at least 20% smaller or at least 50% smaller, which may be characteristic of NTC.

The footprints of the DB contacts 110 in a DB interface 180 may have any desired shape, and multiple DB contacts 110 may be arranged within a DB interface 180 in any desired manner (e.g., by the use of lithographic patterning techniques to form the DB contacts 110). For example, FIGS. 5-8 are top views of various arrangements of DB contacts 110 in a DB dielectric 108 of a DB interface 180. In the embodiment of FIG. 5, the DB contacts 110 have rectangular (e.g., square) footprints and are arranged in a rectangular array. In the embodiment of FIG. 6, the DB contacts 110 have cross-shaped footprints and are arranged in a triangular array. In the embodiment of FIG. 7, the DB contacts 110 are arranged in a rectangular array, and alternating rows of the DB contacts 110 have cross-shaped footprints and triangular footprints. In the embodiment of FIG. 8, the DB contacts 110 are arranged in a rectangular array, the DB contacts 110 have circular footprints, and the diameters of the footprints of the DB contacts 110 vary in a checkerboard pattern. DB contacts 110 included in a DB interface 180 may have any suitable combination of these and other footprint shapes, sizes, and arrangements (e.g., hexagonal arrays, oval footprints, etc.). In some particular embodiments, DB contacts 110 in a DB interface 180 may have footprints shaped as convex polygons (e.g., squares, rectangles, octagons, cross shapes, etc.) or circles.

Figure 10:
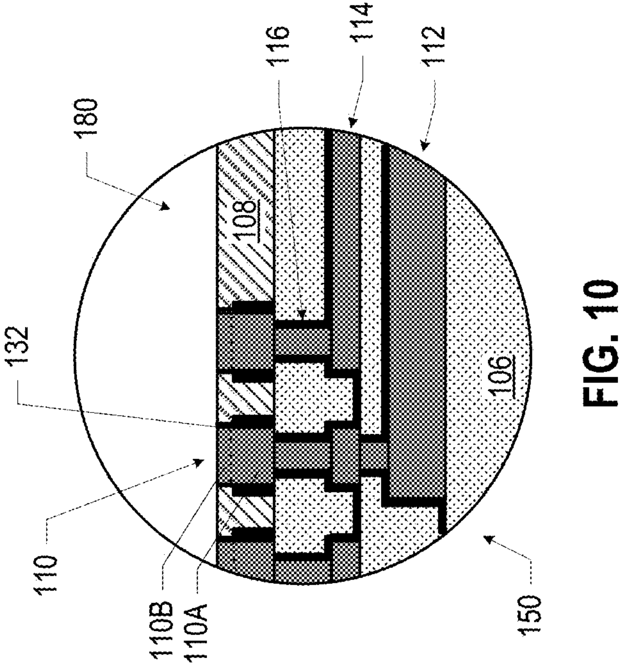
FIGS. 9-10 are side, cross-sectional views of example direct bonding interfaces, in accordance with various embodiments.

As noted above, in some embodiments, a liner may be present between a DB contact 110 and the adjacent DB dielectric 108. For example, FIG. 9 illustrates a portion of an interposer 150 and its DB interface 180. In the embodiment of FIG. 9, a liner 132 is present between the DB contacts 110 and the adjacent DB dielectric 108. The liner 132 may serve as a diffusion barrier (e.g., to limit diffusion between the DB contacts 110 and the adjacent DB dielectric 108, such as the copper diffusion that may occur when the DB contacts 110 include copper and the DB dielectric 108 includes silicon oxide) and/or as an adhesion promoter (e.g., to improve the strength of the mechanical interface between the DB contacts 110 and the adjacent DB dielectric 108). In the particular embodiment of FIG. 9, the liner 132 may not be present around the vias 116 and/or the lines 114 through the insulating material 106 of the interposer 150, or around analogous interconnects such as vias and/or lines of a metallization layer of a microelectronic component other than the interposer 150. In other embodiments, the liner 132 may also be present around the vias 116 and/or the lines 114; such an embodiment is illustrated in FIG. 10. In some embodiments, a liner 132 may only be present around the vias 116 and/or the lines 114, but not around the DB contacts 110 (not shown). In the embodiment of FIG. 9, the liner 132 may be a conductive material (e.g., may include cobalt, ruthenium, or tantalum and nitrogen (e.g., in the form of tantalum nitride)), or a non-conductive material (e.g., silicon and nitrogen (e.g., in the form of silicon nitride), or diamond-like carbon). In the embodiment of FIG. 10, the liner 132 may be a non-conductive material. In other embodiments of FIG. 9 or FIG. 10, the liner 132 may also be present at the bottom of the DB interface 180 (not shown in FIGS. 9 and 10, but shown in the examples of FIGS. 24-29), in which case the liner 132 may be a conductive material. In some embodiments, thickness of the liner 132 on sidewalls of the DB contacts 110 may be greater in portions of DB contacts 110 further away from the bonding surface of the DB interface 180 (i.e., closer to the bottom of the DB contacts 110) than in portions of DB contacts 110 closer to the bonding surface of the DB interface 180 (i.e., closer to the top of the DB contacts 110). Thinner layers of the liner 132 on sidewalls of the DB contacts 110 may be substantially aligned with the second portions 110B of the DB contacts 110, while thicker layers of the liner 132 on sidewalls of the DB contacts 110 may be substantially aligned with the first portions 110A of the DB contacts 110, where the interface between the first portion 110A and the second portion 110B indicated in FIGS. 9 and 10 with dotted lines in the DB contacts 110. In some embodiments, the liner 132 substantially aligned with the first portions 110A of the DB contacts 110 and the liner 132 substantially aligned with the second portions 110B of the DB contacts 110 may have different material compositions. For example, the former may include tantalum, tantalum and nitrogen, titanium, or titanium and nitrogen, and the latter may include titanium. In some embodiments, the liner 132 substantially aligned with the second portions 110B of the DB contacts 110 may have a thickness greater than zero but below about 5 nanometers (e.g., below about 3 nanometers, e.g., between about 1 and 4 nanometers). In some embodiments, the liner 132 substantially aligned with the first portions 110A of the DB contacts 110 may have a thickness greater than about 3 nanometers (e.g., greater than about 5 nanometers, e.g., between about 5 and 50 nanometers). Although various embodiments of the use of liner 132 are depicted in FIGS. 9 and 10 and discussed with respect to their presence in an interposer 150, this is simply for ease of illustration, and DB interfaces 180 of microelectronic components 102 may also include liners 132 (e.g., only around the DB contacts 110, and/or around lines and vias in a metallization stack of the microelectronic component 102).

Figure 11:
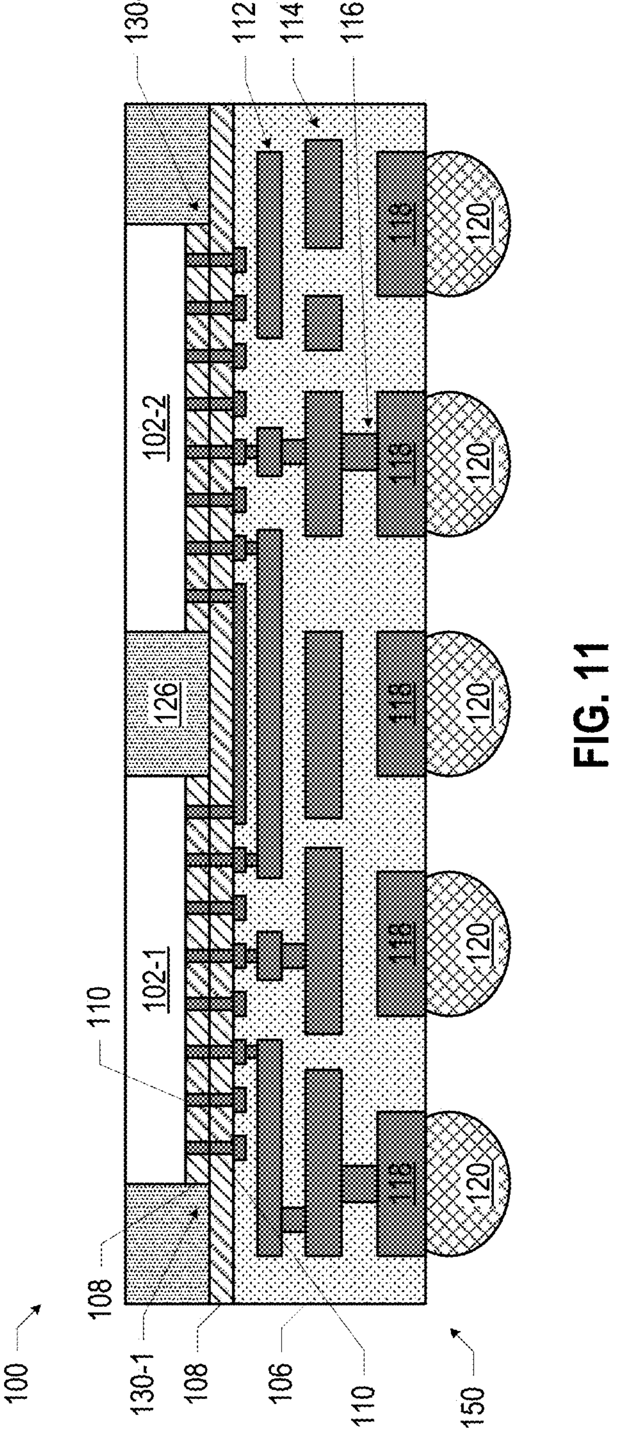
FIG. 11 is a side, cross-sectional view of an example microelectronic assembly including direct bonding, in accordance with various embodiments.

In the embodiment of FIGS. 1 and 2, the DB contacts 110 are shown as pads in contact with vias 116 in the underlying insulating material 106. In other embodiments, the DB contacts 110 may be vias themselves. For example, FIG. 11 illustrates an embodiment in which the DB contacts 110 are vias in contact with pads in the insulating material 106; as shown, the DB contacts 110 may be narrower than the pads with which they are in contact.

Figure 12:
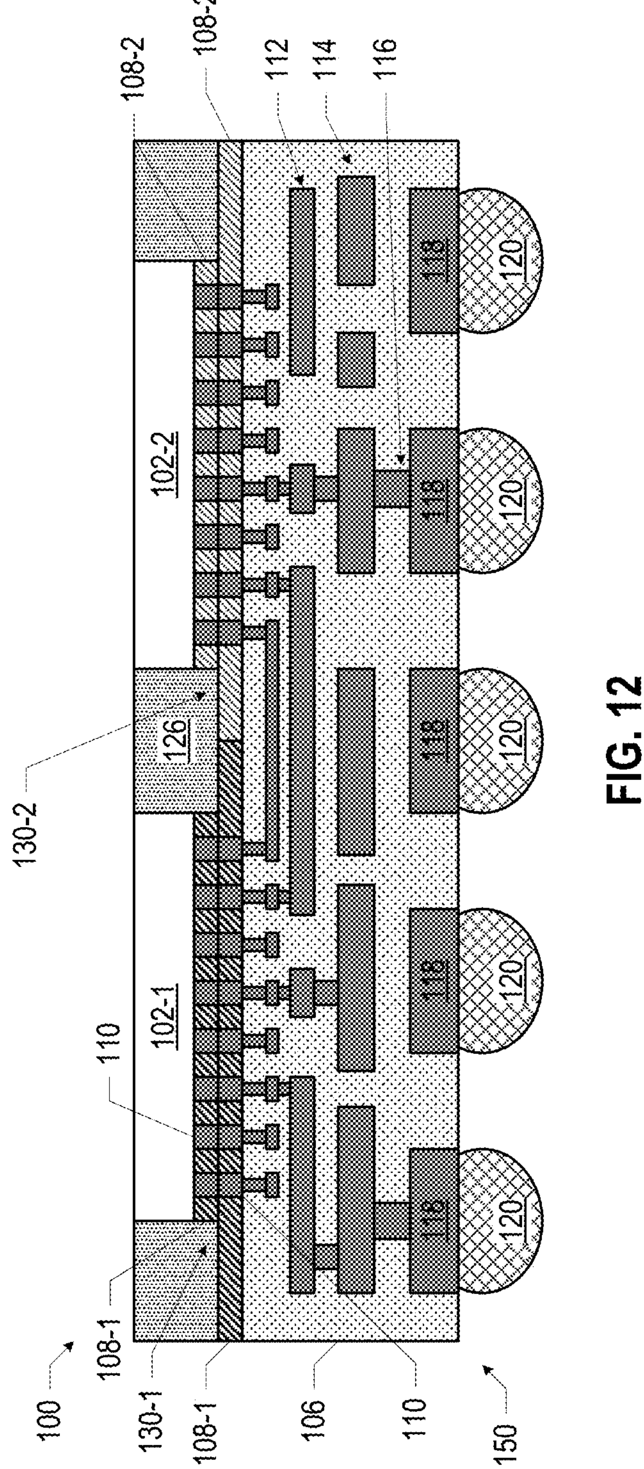
FIGS. 12-14 are side, cross-sectional views of example microelectronic assemblies including direct bonding, in accordance with various embodiments.

Different DB regions 130 in a microelectronic assembly 100 may include different DB dielectrics 108. For example, FIG. 12 illustrates a microelectronic assembly 100 in which a DB region 130-1 includes a DB dielectric 108-1 and a DB region 130-2 includes a different DB dielectric 108-2. The DB dielectrics 108-1 and 108-2 may differ in their material composition and/or their structure. In some embodiments, DB dielectrics 108 in different DB regions 130 may be selected to have different thermal conductivities so as to facilitate and/or limit heat transfer between the interposer 150 and the microelectronic components 102. For example, the DB dielectric 108-1 may have a higher thermal conductivity than the DB dielectric 108-2, resulting in greater heat transfer between the microelectronic component 102-1 and the interposer 150 than between the microelectronic component 102-2 and the interposer 150. In some such embodiments, the DB dielectric 108-1 may include silicon and nitrogen (e.g., in the form of silicon nitride) and the DB dielectric 108-2 may include silicon and oxygen (e.g., in the form of silicon oxide); silicon nitride may have a higher thermal conductivity than silicon oxide, and thus the use of silicon nitride as the DB dielectric 108-1 may enhance local heat transfer from the microelectronic component 102-1 to the interposer 150, while the use of silicon oxide as the DB dielectric 108-2 may mitigate thermal cross-talk through the interposer 150 between the microelectronic component 102-1 and the microelectronic component 102-2.

Figure 13:
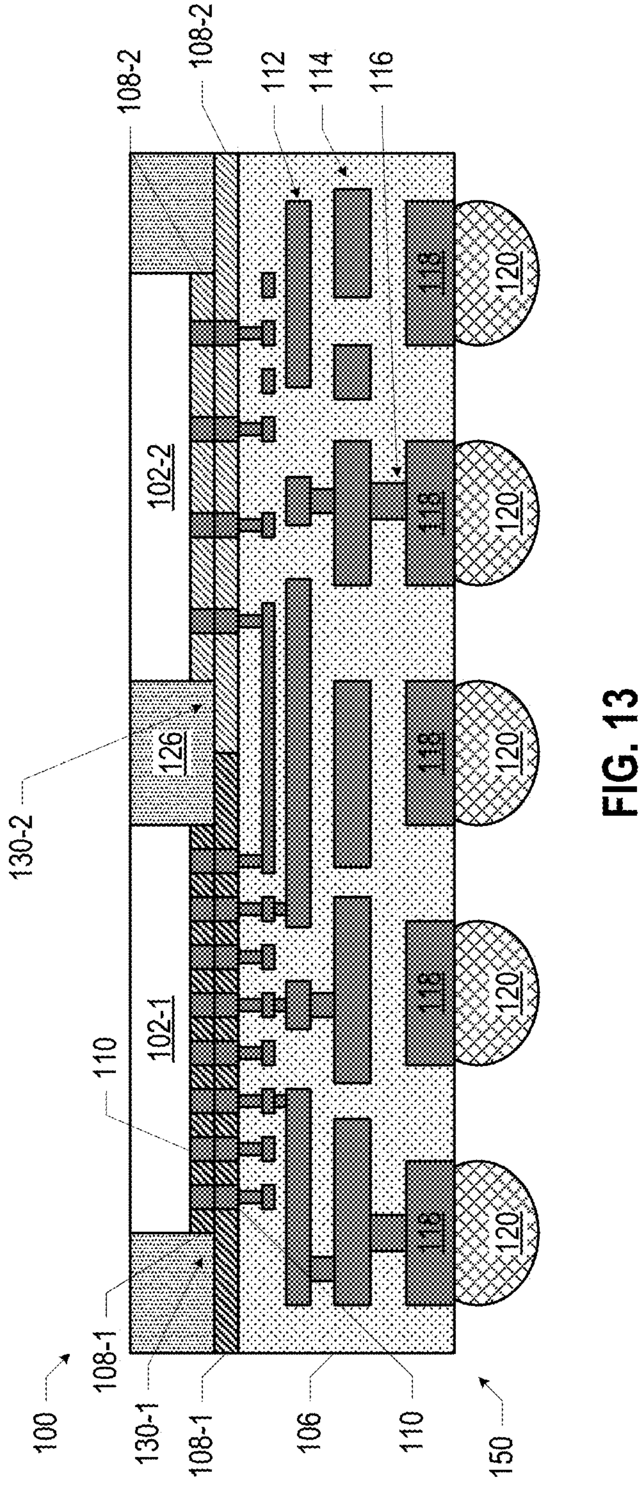

In some embodiments, the density of the DB contacts 110 (i.e., the proportion of the area of a bonding surface of a DB interface 180 occupied by DB contacts 110) may differ between different DB regions 130. In some embodiments, this different density may be due to one DB region 130 requiring fewer electrical pathways than another DB region 130. In other embodiments, this differing density may be used to enhance or suppress heat transfer, with greater density of DB contacts 110 (and therefore a higher proportion of thermally conductive metal) being used to enhance heat transfer and lesser density of DB contacts 110 (and therefore a lower portion of thermally conductive metal) being used to suppress heat transfer. For example, FIG. 13 illustrates an embodiment in which the density of DB contacts 110 is greater in the DB region 130-1 than in the DB region 130-2 to enhance heat transfer between the microelectronic component 102-1 and the interposer 150 and to reduce heat transfer between the microelectronic component 102-2 and the interposer 150. FIG. 13 illustrates different densities of DB contacts 110 being accompanied by the use of different DB dielectrics 108 in different DB regions 130, but in some embodiments, two DB regions 130 may have different densities of DB contacts 110 while having DB dielectrics 108 with the same material composition.

Figures 14, 15, 16:
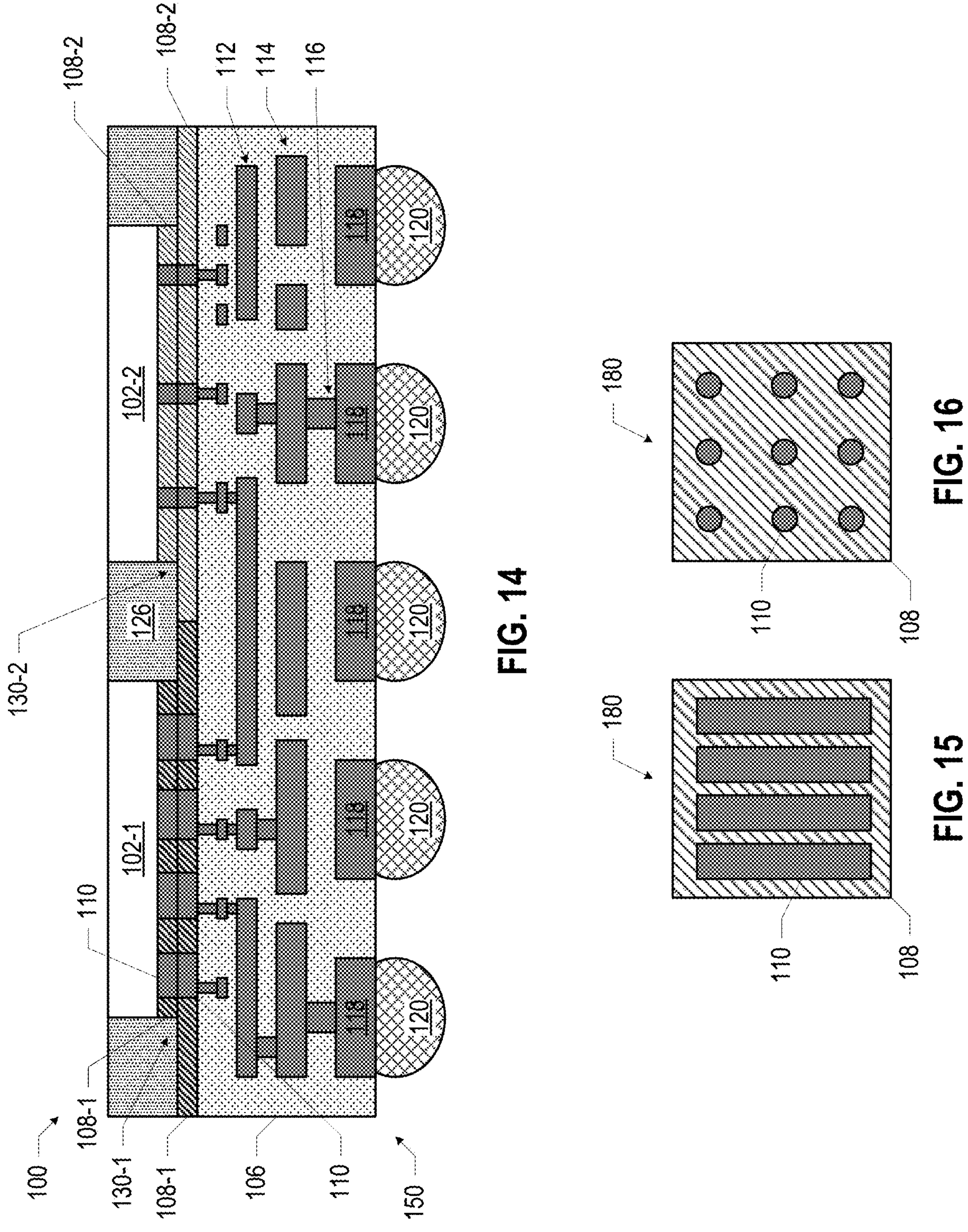
FIGS. 15-16 are top views of example direct bonding interfaces, in accordance with various embodiments.

FIG. 14 illustrates another embodiment of a microelectronic assembly 100 in which, like the embodiment of FIG. 13, the density of DB contacts 110 is greater in the DB region 130-1 than in the DB region 130-2 to enhance heat transfer between the microelectronic component 102-1 and the interposer 150 and to reduce heat transfer between the microelectronic component 102-2 and the interposer 150. In the embodiment of FIG. 13, the size (e.g., the area of the footprint) of the DB contacts 110 of the DB region 130-1 may be the same as the size of the DB contacts 110 of the DB region 130-2; the DB region 130-1 may simply include more DB contacts 110 than the DB region 130-2. In the embodiment of FIG. 14, the size (e.g., the area of the footprint) of the DB contacts 110 of the DB region 130-1 may be greater than the size of the DB contacts 110 of the DB region 130-2; the number of DB contacts 110 of the DB region 130-1 may be the same as, greater than, or less than the number of DB contacts 110 of the DB region 130-2. For example, FIG. 15 is a top view of a DB interface 180 that may correspond to the DB region 130-1 of the microelectronic assembly 100 of FIG. 14, and FIG. 16 is a top view of a DB interface 180 that may correspond to the DB region 130-2 of the microelectronic assembly 100 of FIG. 14. In the embodiment of FIG. 15, the DB contacts 110 may have large rectangular footprints and may be closely spaced relative to the DB contacts 110 of FIG. 16, which may have smaller circular footprints and may be sparsely distributed. Any other suitable combination of size, shape, and distribution of DB contacts 110 may be used in different DB regions 130 of a microelectronic assembly 100 (e.g., to achieve desired thermal properties, or for other purposes); such configurability may not be achievable using other attach technologies, such as solder attach, which conventionally require significant uniformity and regularity in contact location and size in order to achieve reliable attachment.

Figures 17, 18, 19:
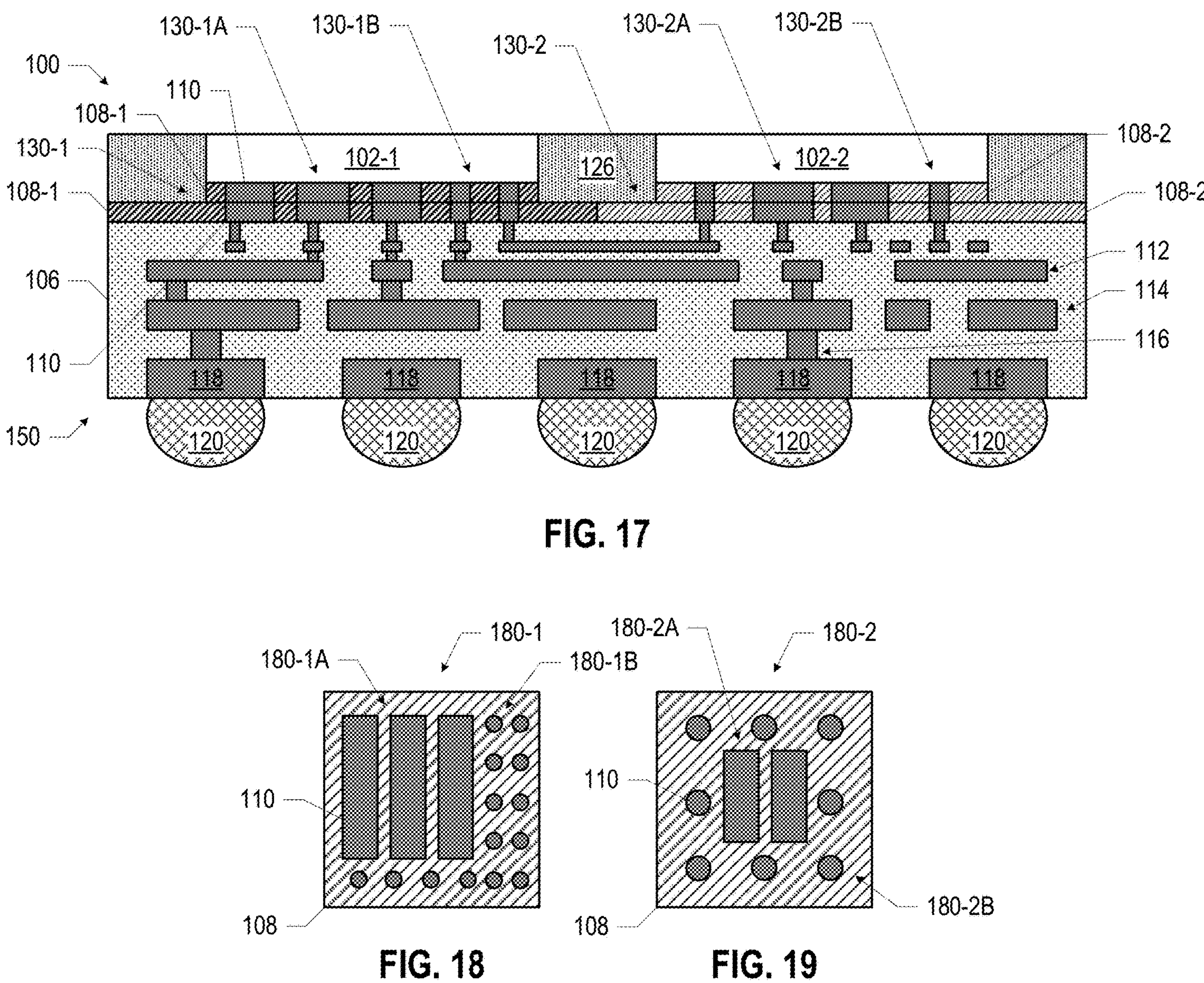
FIG. 17 is a side, cross-sectional view of an example microelectronic assembly including direct bonding regions with multiple subregions, in accordance with various embodiments.
FIGS. 18-19 are top views of example direct bonding interfaces with multiple subregions, in accordance with various embodiments.

In some embodiments, a single DB region 130 may have multiple subregions with different metal density; such embodiments may be advantageous for achieving desired thermal transfer between different portions of a microelectronic component 102 and an interposer 150 or microelectronic component 102. For example, some portions of a microelectronic component 102 may generate more heat than other regions (e.g., a central processing unit (CPU) may have high power areas, such as matrix multipliers and cache areas, and other lower power areas), and thus within a DB region 130, subregions proximate to those portions may have greater metal density (e.g., achieved by any suitable combination of size, shape, and distribution of DB contacts 110) than subregions of the DB region 130 that are not proximate to those portions. In another example, some portions of a microelectronic component 102 may be more sensitive to increases in temperature (e.g., increases in temperature may cause significant negative performance consequences), and thus within a DB region 130, subregions proximate to those portions may have lesser metal density (e.g., achieved by any suitable combination of size, shape, and distribution of DB contacts 110) than subregions of the DB region 130 that are not proximate to those portions. FIG. 17 illustrates a microelectronic assembly 100 in which a DB region 130-1 includes a first subregion 130-1A and a second subregion 130-1B, and the metal density of the first subregion 130-1A is greater than the metal density of the second subregion 130-1B. The microelectronic assembly 100 of FIG. 17 also illustrates a DB region 130-2 that includes a first subregion 130-2A and a second subregion 130-2B, with the metal density of the first subregion 130-2A greater than the metal density of the second subregion 130-2B. FIG. 18 is a top view of a DB interface 180-1 that may correspond to the DB region 130-1 of the microelectronic assembly 100 of FIG. 17, and FIG. 18 is a top view of a DB interface 180-2 that may correspond to the DB region 130-2 of the microelectronic assembly 100 of FIG. 17. In particular, in FIG. 18, a first subregion 180-1A of the DB interface 180-1 may correspond to the first subregion 130-1A of the DB region 130-1 of FIG. 17, and a second subregion 180-1B of the DB interface 180-1 may correspond to the second subregion 130-1B of the DB region 130-1 of FIG. 17; similarly, in FIG. 19, a first subregion 180-2A of the DB interface 180-2 may correspond to the first subregion 130-2A of the DB region 130-2 of FIG. 17, and a second subregion 180-2B of the DB interface 180-2 may correspond to the second subregion 130-2B of the DB region 130-2 of FIG. 17. In the embodiment of FIG. 18, the second subregion 180-1B may partially wrap around the first subregion 180-1A, and in the embodiment of FIG. 19, the second subregion 180-2B may wrap around the first subregion 180-2A; these particular arrangements are simply illustrative, and a DB region 130/DB interface 180 may include any desired arrangement of subregions with different metal densities. Further, although the embodiments of FIGS. 17-19 depict DB regions 130/DB interfaces 180 that include 2 subregions, this is simply illustrative, and a DB region 130/DB interface 180 may include two or more subregions, as desired.

Figure 20:
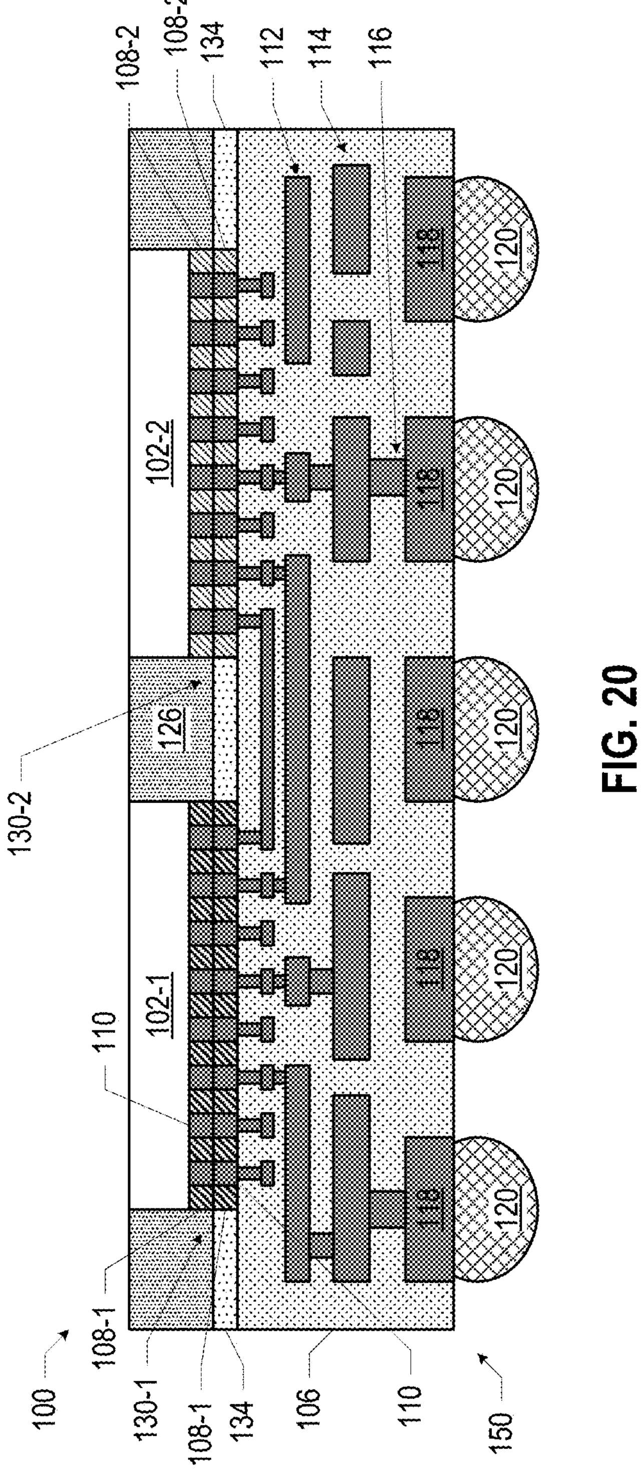
FIGS. 20-21 are side, cross-sectional views of example microelectronic assemblies including direct bonding, in accordance with various embodiments.

In the embodiment of FIGS. 1 and 2, the DB dielectric 108 extends outside of the DB regions 130, covering the remainder of the top surface of the interposer 150. In other embodiments, a different material may be disposed at the top surface of the interposer 150 outside of the DB regions 130. For example, FIG. 20 illustrates a microelectronic assembly 100 in which a material 134, different from the DB dielectrics 108-1 and 108-2, is disposed at the top surface of the interposer 150 (e.g., in contact with the mold material 126). In some embodiments, the material 134 may include one or more dielectric materials, such as one or more organic or inorganic dielectric materials. For example, the material 134 may include an inorganic dielectric material that includes silicon and nitrogen (e.g., in the form of silicon nitride); silicon and oxygen (e.g., in the form of silicon oxide); or silicon, carbon, and nitrogen (e.g., in the form of silicon carbonitride); or the material 134 may include an organic dielectric material, such as a particle-filled epoxide, a polyimide, a particle-filled polyimide, or poly(p-phenylene-2,6-benzobisoxazole)) (PBO). In some embodiments, the material 134 may be a dielectric material, and an additional conductive material (e.g., a metal such as aluminum or copper) may be disposed on the material 134.

A microelectronic assembly 100 may include multiple "tiers" of microelectronic components 102 coupled by direct bonding. For example, FIG. 21 illustrates a microelectronic assembly 100 in which the microelectronic component 102-1 includes two DB interfaces 180 (not labeled) at its top surface, and microelectronic components 102-3 and 102-4 with their own DB interfaces 180 (not labeled) at the bottom surfaces are coupled to the microelectronic component 102-1 via DB regions 130-3 and 130-4, respectively. Similarly, the microelectronic component 102-2 includes a DB interface 180 (not labeled) at its top surface, and a microelectronic component 102-5 with its own DB interface 180 (not labeled) at its bottom surface is coupled to the microelectronic component 102-2 via a DB region 130-5. The microelectronic assembly 100 of FIG. 21 may thus be described as having two tiers of direct bonded microelectronic components 102. Any microelectronic component 102 disclosed herein may include one or more dies and may have different types of pass-through conductive interconnects, such as copper pillars and TSVs (e.g., through-silicon vias).

In some embodiments, the microelectronic components 102-1 and 102-2 in the first tier of the microelectronic assembly 100 of FIG. 21 may include conductive structures 194 that extend between the DB regions 130 at their top and bottom surfaces, providing conductive pathways for power, ground, and/or signals to the microelectronic components 102 in the second tier (i.e., the microelectronic components 102-3, 102-4, and 102-5). In some embodiments, such a conductive structure 194 may include one or more TSVs, including a conductive material via, such as a metal via, isolated from the surrounding silicon or other semiconductor material by a barrier oxide), such as through-silicon vias when the microelectronic components 102-1 and 102-2 include silicon substrates or through-glass vias when the microelectronic components 102-1 and 102-2 include glass substrates. In some embodiments, the microelectronic components 102-1 and 102-2 in a first tier may be passive (e.g., including no transistors) or active (e.g., including transistors in the form of memory circuitry and/or power delivery circuitry).

In the embodiment of FIG. 21, a mold material 126 may extend up to and may laterally surround the microelectronic components 102 in the second tier, and in some embodiments (not shown), the mold material 126 may cover the top surfaces of the microelectronic components 102 in the second tier. In other embodiments, the top surface of the mold material 126 may be coplanar with the exposed DB interfaces 180, or recessed below the exposed DB interfaces 180. In some embodiments, a microelectronic assembly 100 including exposed DB interfaces 180 may have a temporary, removable protective material (e.g., an adhesive material, not shown) on the exposed DB interfaces 180 to protect them until direct bonding operations are performed. Microelectronic assemblies 100 including multiple tiers of microelectronic components 102 may be formed in any suitable manner, with the additional tiers of microelectronic components 102 coupled to the preceding assemblies prior to deposition of the mold material 126. In some other embodiments, a microelectronic assembly 100 including multiple tiers of microelectronic components 102 may be formed by first assembling the tiers of microelectronic components 102, and then coupling the assembled tiers to an interposer 150. A microelectronic assembly 100 may not be limited to two tiers of microelectronic components 102, but may include three or more tiers, as desired. Further, although the microelectronic components 102 in an individual tier in FIG. 21 are depicted as having a same height, this is simply for ease of illustration, and microelectronic components 102 in any individual tier in a microelectronic assembly 100 may have different heights. Further, not every microelectronic component 102 in a microelectronic assembly 100 may be part of a stack of multiple microelectronic components 102; for example, in some variants of the microelectronic assembly 100 of FIG. 21, no microelectronic component 102-5 may be present on top of the microelectronic component 102-2 (and thus the microelectronic component 102-2 may not include conductive structures 194 (e.g., may not include TSVs).

In some embodiments, a microelectronic assembly 100 may include one or more DB interfaces 180 exposed at a surface of the microelectronic assembly 100. Although various ones of the preceding drawings illustrate DB regions 130 at a single surface of the interposer 150 (e.g., the top surface), a microelectronic assembly 100 may include DB regions 130 at multiple surfaces of an interposer 150. In some embodiments, a microelectronic component 102 coupled by direct bonding to a bottom surface of the interposer 150 may include conductive contacts on its bottom surface for coupling to another component (e.g., a support component 182).

The microelectronic assembly 100 of FIGS. 1 and 2, and others of the microelectronic assemblies 100 disclosed herein, may be manufactured in any suitable manner. For example, FIGS. 22-29 are side, cross-sectional views of example stages in the manufacture of a portion of the microelectronic assembly 100 of FIGS. 1 and 2, in accordance with various embodiments. In particular, FIGS. 22-29 illustrates manufacturing stages in providing a DB interface 180 for an example microelectronic component 202, which may be one of the microelectronic components 102 or an interposer 150, so that the microelectronic component 202 could be coupled to another microelectronic component 202 with an analogous DB interface 180 by direct bonding using NTC.

Although the operations discussed with reference to FIGS. 22-29 may be illustrated with reference to particular embodiments of the microelectronic assemblies 100 disclosed herein, the manufacturing methods discussed with reference to FIGS. 22-29 may be used to form any suitable microelectronic assemblies 100.

Operations are illustrated once each and in a particular order in FIGS. 22-29, but the operations may be reordered and/or repeated as desired (e.g., with different operations performed in parallel when manufacturing multiple microelectronic assemblies 100 simultaneously). In other embodiments, any other suitable manufacturing processes may be used to manufacture any of the microelectronic assemblies 100 disclosed herein.

Figures 22, 23, 24, 25:
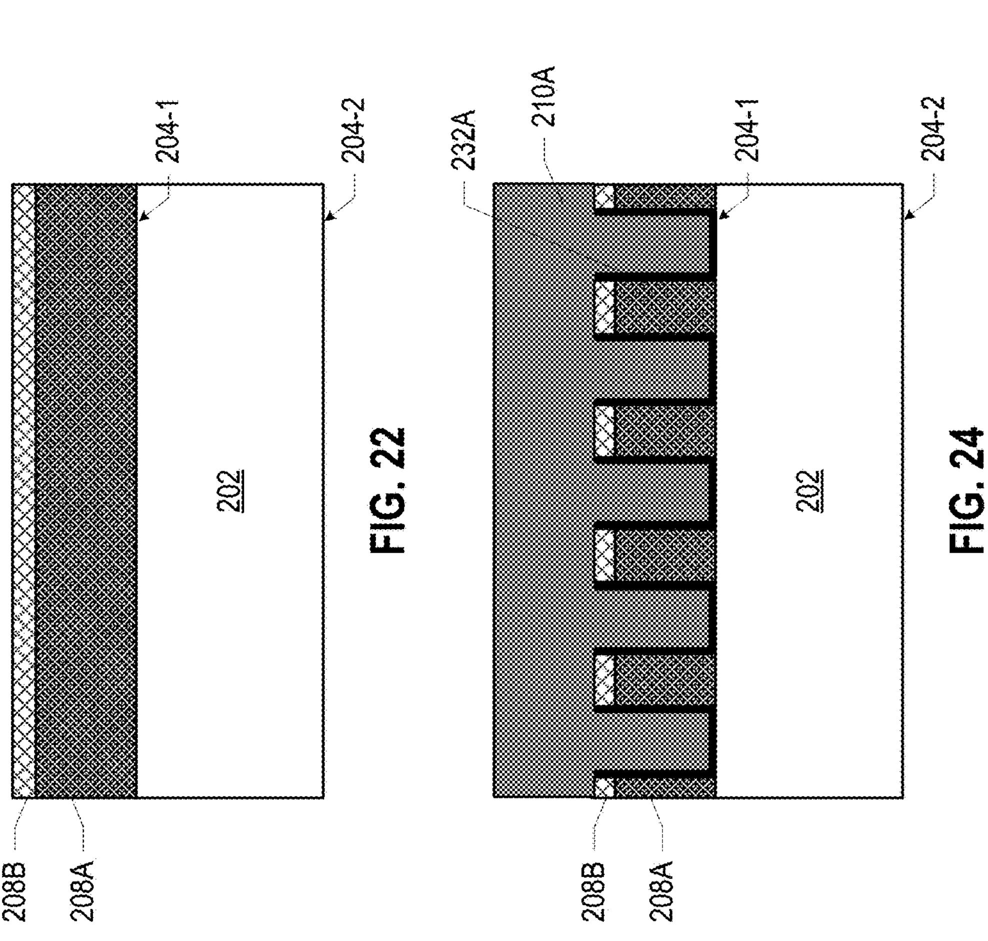
FIGS. 22-29 are side, cross-sectional views of example stages in the manufacture of a portion of a microelectronic assembly with direct bonding using nanotwinned copper (NTC), in accordance with various embodiments.

FIG. 22 illustrates an assembly including a microelectronic component 202 having a first face 204-1, and an opposing second face 204-2. A layer of a first dielectric material 208A is disposed over the first face 204-1, e.g., in contact with the first face 204-1; and a layer of a second dielectric material 208B is disposed over the layer of the first dielectric material 208A, e.g., in contact with the first dielectric material 208A. The first dielectric material 208A and the second dielectric material 208B may include any of the dielectric materials of, respectively, the first portion 108A and the second portion 108B of the DB dielectric 108, described above. Any suitable deposition techniques may be used to provide layers of the first dielectric material 208A and the second dielectric material 208B over the microelectronic component 202, such as, atomic layer deposition (ALD), chemical vapor deposition (CVD), plasma-enhanced CVD (PECVD), physical vapor deposition (PVD) processes such as sputter, spin-coating or dip-coating. Thicknesses of layers of the first dielectric material 208A and the second dielectric material 208B may be those of, respectively, the first portion 108A and the second portion 108B of the DB dielectric 108, described above.

FIG. 23 illustrates an assembly subsequent to providing openings 206 in the layers of the first dielectric material 208A and the second dielectric material 208B of the assembly of FIG. 22. In particular, as shown in FIG. 23, the openings 206 may extend through the second dielectric material 208B and through the first dielectric material 208A to expose portions of the first face 204-1 of the microelectronic component 202 at the bottom of the openings 206. Dimensions of the openings 206 may be those of the DB contacts 110, described above. Any suitable manufacturing techniques may be used to provide the openings 206 in the layers of the first dielectric material 208A and the second dielectric material 208B. In some embodiments, any suitable patterning technique may be used to provide a mask defining locations and dimensions for the openings 206, such as, but not limited to, photolithographic or electron-beam (e-beam) patterning. Then any suitable etching technique may be used to remove the first dielectric material 208A and the second dielectric material 208B from portions exposed by the mask. Examples of etching techniques include, but are not limited to, a dry etch, such as e.g., radio frequency (RF) reactive ion etch (RIE) or inductively coupled plasma (ICP) RIE. In some embodiments, an etch to form the openings 206 may include an anisotropic etch, using etchants in a form of e.g., chemically active ionized gas (i.e., plasma) using e.g., bromine (Br) and chloride (Cl) based chemistries. In some embodiments, during an etch to form the openings 206, the assembly may be heated to elevated temperatures, e.g., to temperatures between about room temperature and 200 degrees Celsius, including all values and ranges therein, to promote that byproducts of the etch are made sufficiently volatile to be removed from the surface. The process may further include removing the mask once the openings 206 have been formed.

FIG. 24 illustrates an assembly subsequent to lining sidewalls and, optionally, bottoms of the openings 206 of the assembly of FIG. 23 with a first liner 232A and then depositing a first electrically conductive material 210A into the openings 206 lined with the first liner 232A. The first liner 232A may include any of the materials and may have a thickness as described above with reference to the liner 132 substantially aligned with the first portions 110A of the DB contacts 110. The first electrically conductive material 210A may include any of the electrically conductive materials of the first portion 110A of the DB contacts 110, described above. Any suitable deposition techniques may be used to provide the first liner 232A on sidewalls of the openings 206, such as ALD. Any suitable deposition techniques may then be used to fill the openings 206 lined with the first liner 232A with the first electrically conductive material 210A, such as ALD, CVD, PECVD, or PVD. As shown in FIG. 24, as a result of depositing the first electrically conductive material 210A into the openings 206, the first electrically conductive material 210A may not only fill the openings 206 but also be provided over the top of the openings 206.

FIG. 25 illustrates an assembly subsequent to removing excess of the first electrically conductive material 210A of the assembly of FIG. 24 so that the top surface of the first electrically conductive material 210A is aligned to the top of the openings 206. As a result, the second dielectric material 208B is exposed at the top of the assembly, between the openings 206 filled with the first electrically conductive material 210A. Any suitable planarization technique may be used to remove the overburden of the first electrically conductive material 210A, such as CMP.

Figures 26, 27, 28, 29:
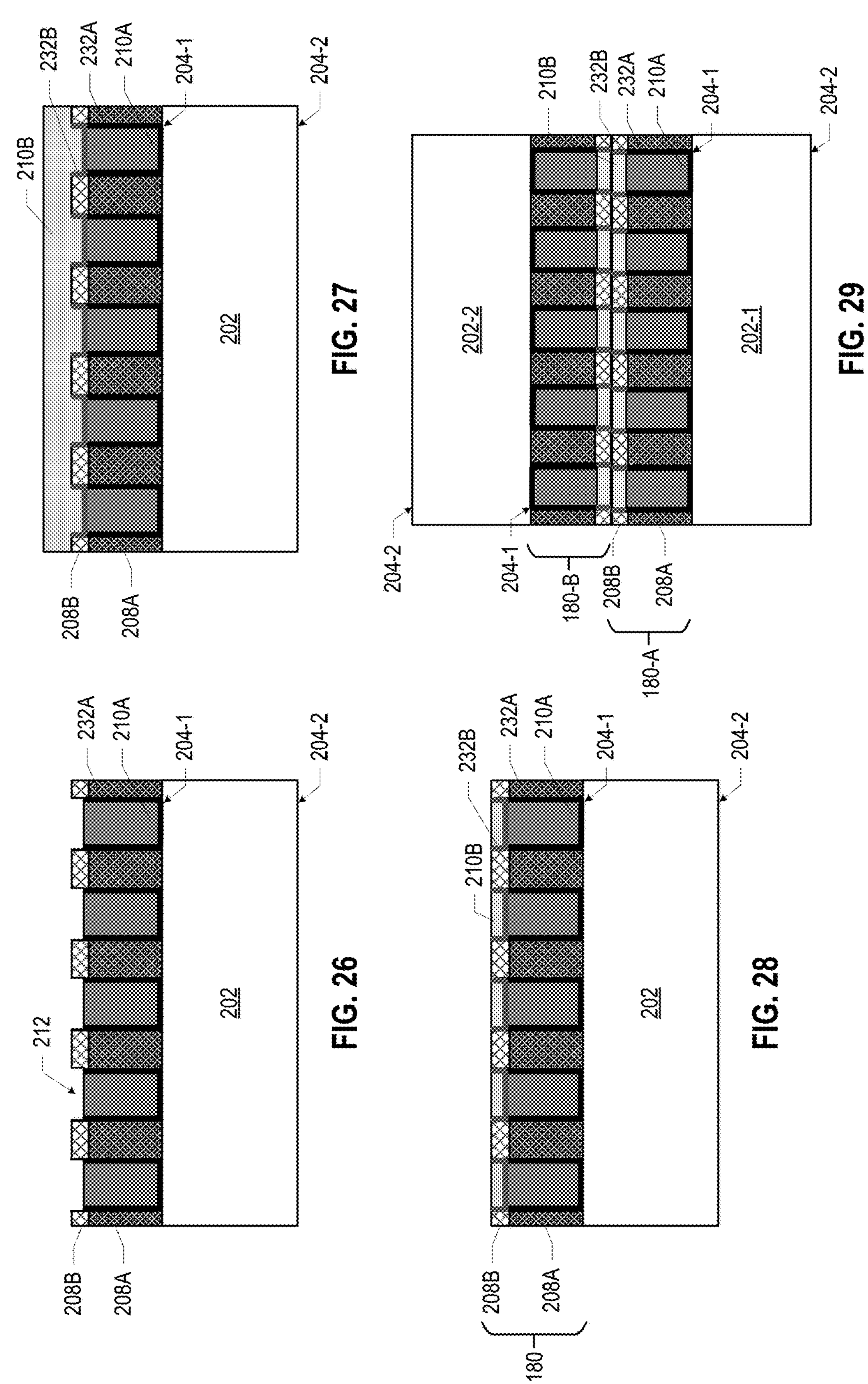

FIG. 26 illustrates an assembly subsequent to recessing the first electrically conductive material 210A in the openings 206 of the assembly of FIG. 25, thus forming recesses 212. In particular, as shown in FIG. 26, the first electrically conductive material 210A may be recessed by a depth of up to about 300 nanometers. The first liner 232A may be recessed similarly. Thus, in some embodiments, the recesses 212 may not have any of the first liner 232A on their sidewalls or, phrased differently, the first liner 232A may be substantially aligned with the first electrically conductive material 210A in the openings 206. Any suitable etching techniques may be used to form the recesses 212 in the first electrically conductive material 210A, such as any suitable dry etching or wet etching techniques. The first electrically conductive material 210A may be etch-selective with respect to the first dielectric material 208A and the second dielectric material 208B. In general, material A may be described as "etch-selective" with respect to material B if etchants that may be used to etch material A do not substantially etch material B. Thus, etchants used to form the recesses 212 in the first electrically conductive material 210A may be such that the first dielectric material 208A and the second dielectric material 208B are not etched.

FIG. 27 illustrates an assembly subsequent to lining sidewalls and bottoms of the recesses 212 of the assembly of FIG. 26 with a second liner 232B and then depositing a second electrically conductive material 210B into the recesses 212 lined with the second liner 232B. The second liner 232B may include any of the materials and may have a thickness as described above with reference to the liner 132 substantially aligned with the second portions 110B of the DB contacts 110. Any suitable deposition techniques may be used to provide the second liner 232B on sidewalls and bottoms of the recesses 212, such as ALD. Any suitable deposition techniques may then be used to fill the recesses 212 lined with the second liner 232B with the second electrically conductive material 210B, such as ALD, CVD, PECVD, or PVD. As shown in FIG. 27, as a result of depositing the second electrically conductive material 210B into the recesses 212, the second electrically conductive material 210B may not only fill the recesses 212 but also be provided over the top of the recesses 212.

FIG. 28 illustrates an assembly subsequent to removing excess of the second electrically conductive material 210B of the assembly of FIG. 27 so that the top surface of the second electrically conductive material 210B is aligned to the top of the openings 206 formed in the assembly of FIG. 23. As a result, the second dielectric material 208B is exposed at the top of the assembly, between the openings 206 filled, at the bottom and the bulk portion of the openings 206, with the first electrically conductive material 210A, and filled at the top of the openings 206 with the second electrically conductive material 210B. Any suitable planarization technique may be used to remove the overburden of the second electrically conductive material 210B, such as CMP.

The openings 206 filled with the first electrically conductive material 210A and the second electrically conductive material 210B, and enclosed with dielectric materials 208A and 208B as shown in FIG. 28 form a DB interface 180 at the first face 204-1 of the microelectronic component 202. FIG. 29 illustrates that two such microelectronic components 202 may then be arranged so that their respective interfaces 180 face one another, in order to perform direct bonding of these interfaces. In particular, FIG. 29 illustrates a first microelectronic component 202-1 with a first interface 180-A opposite a second microelectronic component 202-2 with a second interface 180-B. For example, the first microelectronic component 202-1 of FIG. 29 may be the interposer 150 of FIG. 2, the first interface 180-A of FIG. 29 may be the interface 180-1A of FIG. 2, the second microelectronic component 202-2 of FIG. 29 may be the microelectronic component 102-1 of FIG. 2, and the second interface 180-B of FIG. 29 may be the interface 180-1B of FIG. 2. FIG. 29 does not illustrate the second liner 232B at the interface between the first electrically conductive material 210A and the second electrically conductive material 210B (i.e., the second liner 232B that was deposited at the bottoms of the recesses 212 as shown in the assembly of FIG. 28) because, after the direct bonding of the microelectronic components 202-1 and 202-2, that portion of the second liner 232B may diffuse in the first electrically conductive material 210A and/or the second electrically conductive material 210B and no longer be detectable in the final device. However, for a given DB interface 180 of FIG. 29, the first liner 232A and the second liner 232B may be as portions of the liner 132 described above with reference to FIGS. 9 and 10 (e.g., in terms of their different thicknesses and/or different material compositions).

The microelectronic components 102 and microelectronic assemblies 100 disclosed herein may be included in any suitable electronic component. FIGS. 32-35 illustrate various examples of apparatuses that may include, or be included in, as suitable, any of the microelectronic components 102 and microelectronic assemblies 100 disclosed herein.

Figure 32:
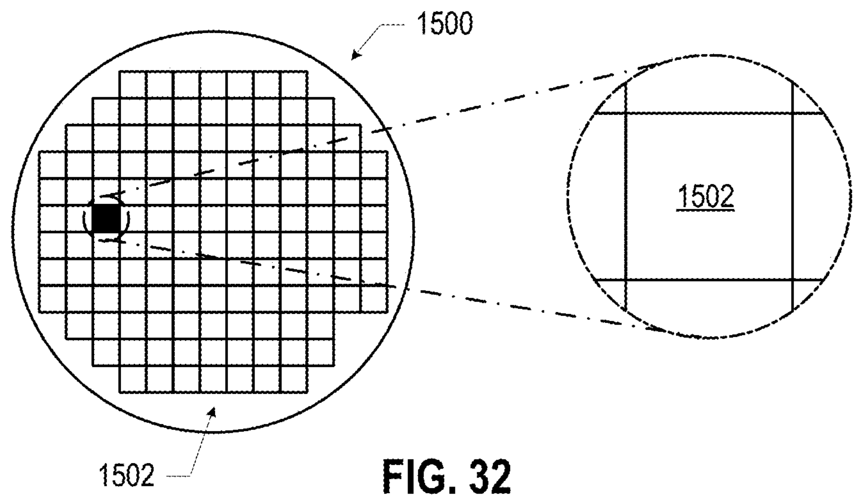
FIG. 32 is a top view of a wafer and dies that may be included in a microelectronic component in accordance with any of the embodiments disclosed herein.

FIG. 32 is a top view of a wafer 1500 and dies 1502 that may be included in any of the microelectronic components 102 disclosed herein. For example, a die 1502 may serve as a microelectronic component 102, or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 33, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 35) or other logic that is configured to store information in the memory devices or execute instructions stored in the memory array.

Figure 33:
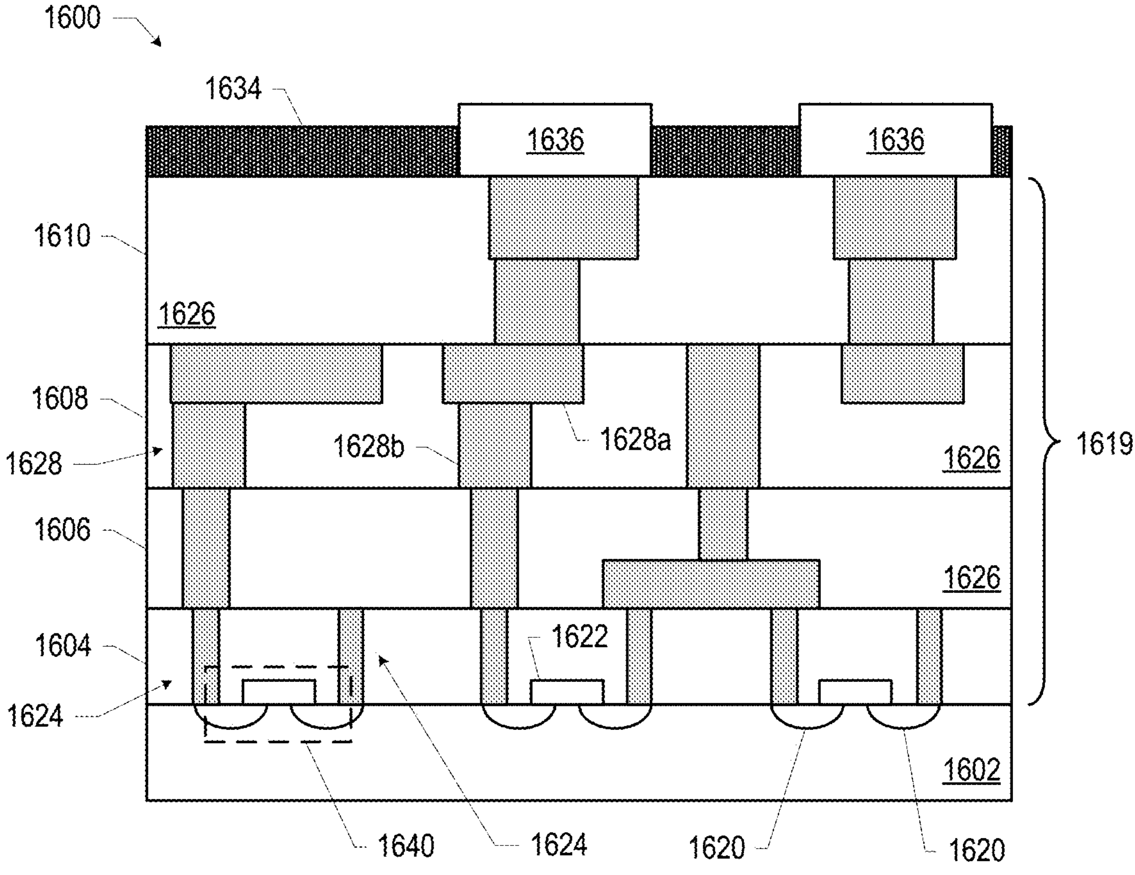
FIG. 33 is a side, cross-sectional view of an IC device that may be included in a microelectronic component in accordance with any of the embodiments disclosed herein.

FIG. 33 is a side, cross-sectional view of an IC device 1600 that may be included in any of the microelectronic components 102 disclosed herein. For example, an IC device 1600 (e.g., as part of a die 1502, as discussed above with reference to FIG. 32) may serve as a microelectronic component 102, or may be included in a microelectronic component 102. One or more of the IC devices 1600 may be included in one or more dies 1502 (FIG. 32). The IC device 1600 may be formed on a substrate 1602 (e.g., the wafer 1500 of FIG. 32) and may be included in a die (e.g., the die 1502 of FIG. 32). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 32) or a wafer (e.g., the wafer 1500 of FIG. 32).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 33 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 33 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 33). Although a particular number of interconnect layers 1606-1610 is depicted in FIG. 33, embodiments of the present disclosure include IC devices having more or fewer interconnect layers than depicted.

In some embodiments, the interconnect structures 1628 may include lines **1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 33. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610** together.

The interconnect layers 1606-1610 may include a dielectric material 1626 disposed between the interconnect structures 1628, as shown in FIG. 33. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines **1628*a* and/or vias 1628*b*, as shown. The lines 1628*a* of the first interconnect layer 1606 may be coupled with contacts (e.g., the S/D contacts 1624) of the device layer 1604**.

A second interconnect layer 1608 may be formed above the first interconnect layer 1606. In some embodiments, the second interconnect layer 1608 may include vias **1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b*** may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 33, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 34:
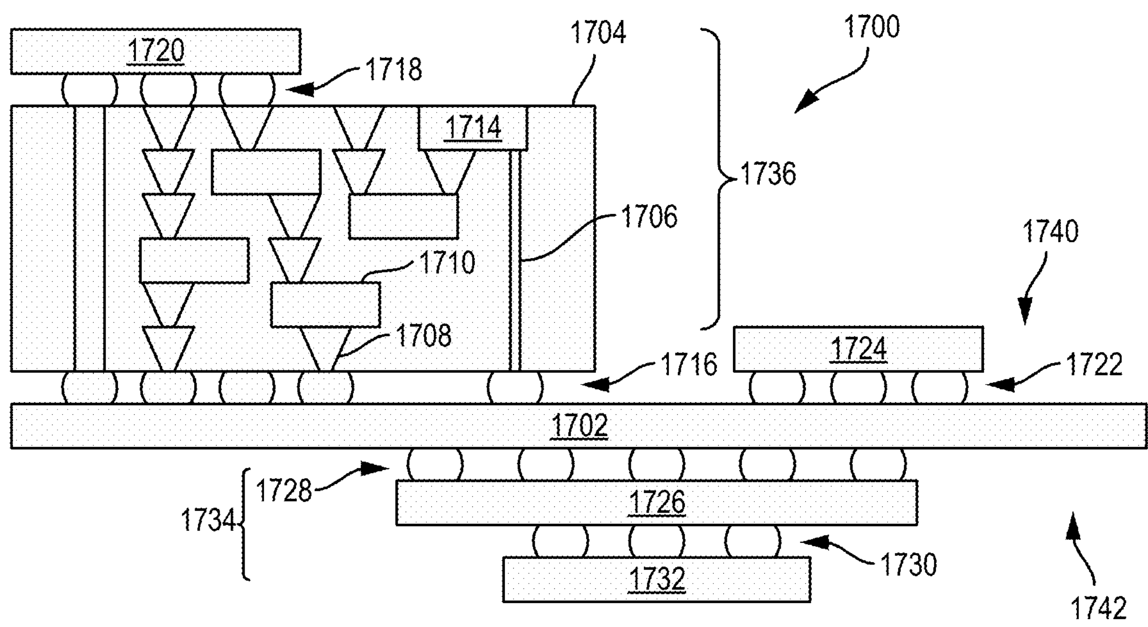
FIG. 34 is a side, cross-sectional view of an IC device assembly that may include a microelectronic assembly in accordance with any of the embodiments disclosed herein.

FIG. 34 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by direct bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 34 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 34), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 34, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 32), an IC device (e.g., the IC device 1600 of FIG. 33), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 34, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 34 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 35:
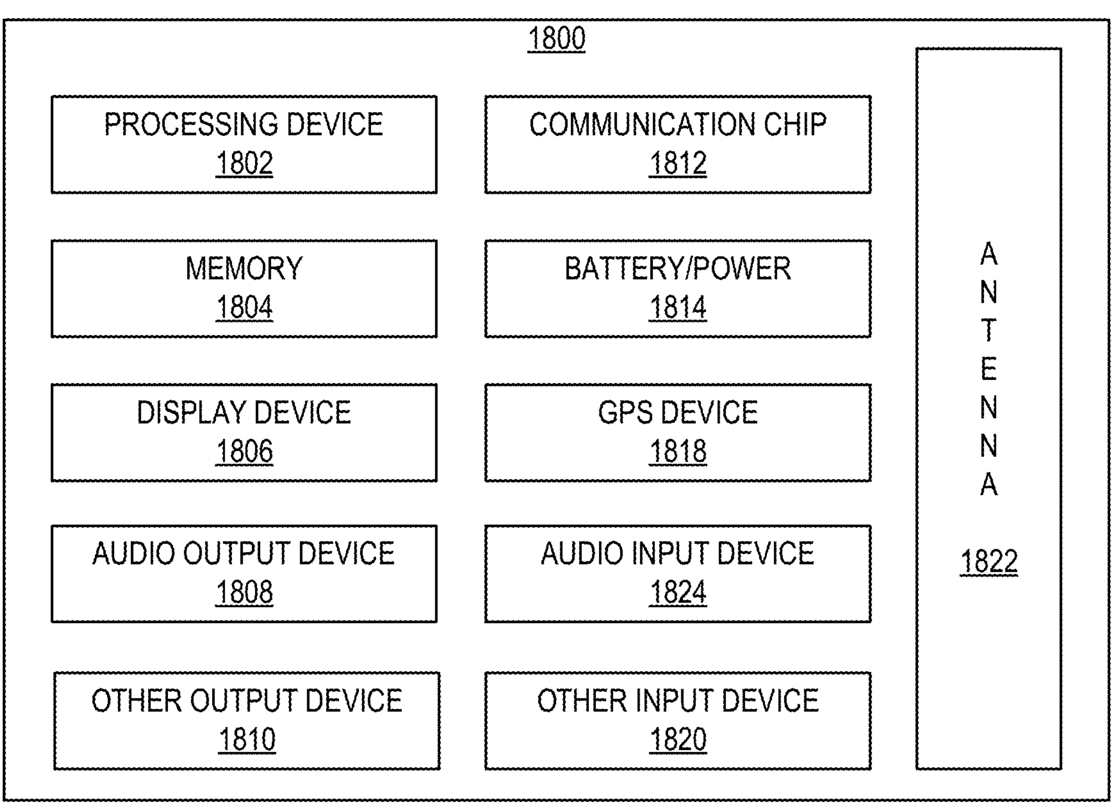
FIG. 35 is a block diagram of an example electrical device that may include a microelectronic assembly in accordance with any of the embodiments disclosed herein.

FIG. 35 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 35 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 35, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), CPUs, graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM), nonvolatile memory (e.g., read-only memory (ROM), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 provides a microelectronic assembly, including: a first microelectronic component; and a second microelectronic component coupled to the first microelectronic component by a direct bonding region, where the direct bonding region includes a direct bonding contact including a first portion and a second portion, the first portion is between the first microelectronic component and the second portion, the second portion is between the first portion and the second microelectronic component (e.g., the second portion is a portion of the DB contact that is closest to the bonding surface of the DB interface) and the first portion and the second portion have different microstructures.

Example 2 provides the microelectronic assembly according to example 1, where the first portion and the second portion having different microstructures includes the first portion and the second portion having different grain orientations.

Example 3 provides the microelectronic assembly according to examples 1 or 2, where at least about 50% of grains of the second portion have a <111> orientation, and less than about 40% of grains of the first portion have the <111> orientation. For example, in some embodiments, the first portion may have between about 30% and 35% of grains with <111> orientation. In some embodiments, the second portion may have more than about 55% or more than about 60% of grains with <111> orientation.

Example 4 provides the microelectronic assembly according to any one of the preceding examples, where at least about 50% of grains of the second portion, e.g., at least about 60% or at least about 65%, e.g., between about 50% and 95%, have a <111> orientation.

Example 5 provides the microelectronic assembly according to any one of the preceding examples, where grains of the first portion have random orientation (e.g., grains of the first portion may have about equal distribution of different crystallographic orientations, such as <111>, <101>, and <001> orientations).

Example 6 provides the microelectronic assembly according to any one of the preceding examples, where the second portion has a columnar microstructure, and the first portion has a non-columnar microstructure.

Example 7 provides the microelectronic assembly according to any one of the preceding examples, where the first portion and the second portion having different microstructures includes the first portion and the second portion having different average grain dimensions.

Example 8 provides the microelectronic assembly according to any one of examples 1-7, where an average grain dimension of grains in the first portion is at least about 2.5 micron (e.g., at least about 3 micron, between about 3-6 micron, or between about 5-6 micron).

Example 9 provides the microelectronic assembly according to any one of examples 1-8, where the first portion includes polycrystalline copper.

Example 10 provides the microelectronic assembly according to any one of examples 1-7, where an average grain dimension of grains in the first portion is less than about 3 micron (e.g., less than about 2.5 micron, between about 1-3 micron, or between about 2-3 micron).

Example 11 provides the microelectronic assembly according to any one of examples 1-7 or 10, where the first portion includes fine-grained copper.

Example 12 provides the microelectronic assembly according to any one of the preceding examples, where an average total grain length of grains in the second portion is at least about 1 micron (e.g., between about 1 and 3 micron, e.g., between about 1-2 micron).

Example 13 provides the microelectronic assembly according to example 12, where an average total grain width of grains in the second portion is at least 20% smaller than the average total grain length.

Example 14 provides the microelectronic assembly according to any one of the preceding examples, where the second portion includes nanotwinned copper.

Example 15 provides the microelectronic assembly according to any one of the preceding examples, where a thickness of the first portion is at least about 400 nanometers.

Example 16 provides the microelectronic assembly according to any one of the preceding examples, where a thickness of the second portion is less than about 300 nanometers.

Example 17 provides the microelectronic assembly according to any one of the preceding examples, where the direct bonding contact further includes a third portion, the second portion is between the first portion and the third portion, the third portion is between the second portion and the second microelectronic component, and the first portion and the third portion have substantially same microstructures.

Example 18 provides the microelectronic assembly according to any one of the preceding examples, where the direct bonding contact further includes a third portion, the second portion is between the first portion and the third portion, the third portion is between the second portion and the second microelectronic component, and the second portion and the third portion have different microstructures.

Example 19 provides the microelectronic assembly according to any one of the preceding examples, where the direct bonding region further includes a direct bonding dielectric including a first portion and a second portion, the first portion of the direct bonding dielectric is between the first microelectronic component and the second portion of the direct bonding dielectric, the second portion of the direct bonding dielectric is between the first portion and the second microelectronic component (e.g., the second portion of the direct bonding dielectric is a portion of the DB dielectric that is closest to the bonding surface of the DB interface), and an atomic percentage of carbon in the first portion of the direct bonding dielectric is lower than an atomic percentage of carbon in the second portion of the direct bonding dielectric.

Example 20 provides the microelectronic assembly according to example 19, where the atomic percentage of carbon in the first portion of the direct bonding dielectric is below 25%, e.g., below about 22%, e.g., between about 0-25%, and where the atomic percentage of carbon in the second portion of the direct bonding dielectric is above 25%, e.g., between about 25-45% or between about 25-35%.

Example 21 provides the microelectronic assembly according to any one examples 19-20, where a thickness of the first portion of the direct bonding dielectric is at least 300 nanometers.

Example 22 provides the microelectronic assembly according to any one examples 19-21, where a thickness of the second portion of the direct bonding dielectric is less than 300 nanometers.

Example 23 provides the microelectronic assembly according to any one examples 19-22, where the direct bonding dielectric further includes silicon and nitrogen.

Example 24 provides the microelectronic assembly according to any one of the preceding examples, where the first microelectronic component is a die and the second microelectronic component is one of a further die, an interposer, a package substrate, or a circuit board.

Example 25 provides the microelectronic assembly according to any one of the preceding examples, further including a heat spreader.

Example 26 provides the microelectronic assembly according to example 25, further including a TIM between the first microelectronic component and the heat spreader.

Example 27 provides a microelectronic assembly that includes a first microelectronic component and a second microelectronic component coupled to the first microelectronic component by a direct bonding contact, where the direct bonding contact includes a first portion and a second portion, the first portion is between the first microelectronic component and the second portion, the second portion is between the first portion and the second microelectronic component (e.g., the second portion is the cap portion and the first portion is a bulk portion of a DB contact), less than about 40% of grains of the first portion have a <111> orientation, and at least about 50% of grains of the second portion have the <111> orientation.

Example 28 provides the microelectronic assembly according to example 27, further including a direct bonding dielectric between the first microelectronic component and the second microelectronic component, where the direct bonding dielectric encloses sidewalls of the direct bonding contact, the direct bonding dielectric includes a first portion and a second portion, the first portion of the direct bonding dielectric is between the first microelectronic component and the second portion of the direct bonding dielectric, the second portion of the direct bonding dielectric is between the first portion and the second microelectronic component, and an atomic percentage of carbon in the first portion of the direct bonding dielectric is lower than an atomic percentage of carbon in the second portion of the direct bonding dielectric.

Example 29 provides a microelectronic assembly that includes a first microelectronic component and a second microelectronic component coupled to the first microelectronic component by a direct bonding contact, where the direct bonding contact includes a first portion and a second portion, the first portion is between the first microelectronic component and the second portion, the second portion is between the first portion and the second microelectronic component (e.g., the second portion is the cap portion and the first portion is a bulk portion of a DB contact), the first portion includes polycrystalline copper or fine-grained copper, and the second portion includes nanotwinned copper.

Example 30 provides the microelectronic assembly according to example 29, further including a direct bonding dielectric between the first microelectronic component and the second microelectronic component, where the direct bonding dielectric encloses sidewalls of the direct bonding contact, the direct bonding dielectric includes a first portion and a second portion, the first portion of the direct bonding dielectric is between the first microelectronic component and the second portion of the direct bonding dielectric, the second portion of the direct bonding dielectric is between the first portion and the second microelectronic component, and an atomic percentage of carbon in the first portion of the direct bonding dielectric is lower than an atomic percentage of carbon in the second portion of the direct bonding dielectric.

Example 31 provides a system that includes a circuit board and a microelectronic assembly, communicatively coupled to the circuit board, where the microelectronic assembly is a microelectronic assembly according to any one of the preceding examples.

Example 32 provides the system according to example 31, where the circuit board is a motherboard.

Example 33 provides the system according to examples 31 or 32, where the system further includes a display communicatively coupled to the circuit board.

Example 34 provides the system according to any one of examples 31-33, where the system is a handheld computing system.

Example 35 provides the system according to any one of examples 31-34, where the system is a wearable computing system.

Example 36 provides the system according to any one of examples 31-33, where the system is a server computing system.

Example 37 provides the system according to any one of examples 31-33, where the system is a vehicular computing system.

Example 38 provides the system according to any one of examples 31-37, where the system further includes a wireless communication device communicatively coupled to the circuit board.

Example 39 provides the system according to any one of examples 31-37, where the system further includes a housing around the microelectronic assembly and the circuit board.

The invention claimed is:

1. A microelectronic assembly, comprising:

a first microelectronic component; and a second microelectronic component coupled to the first microelectronic component by a direct bonding region, wherein the direct bonding region includes a direct bonding contact comprising a first portion and a second portion, the first portion is between the first microelectronic component and the second portion, and the first portion and the second portion have different microstructures.

2. The microelectronic assembly according to claim 1, wherein the first portion and the second portion having different microstructures includes the first portion and the second portion having different grain orientations.

3. The microelectronic assembly according to claim 1, wherein at least about 50% of grains of the second portion have a <111> orientation, and less than about 40% of grains of the first portion have the <111> orientation.

4. The microelectronic assembly according to claim 1, wherein grains of the first portion have substantially random orientation.

5. The microelectronic assembly according to claim 1, wherein the second portion has a columnar microstructure and the first portion has a non-columnar microstructure.

6. The microelectronic assembly according to claim 1, wherein the first portion and the second portion having different microstructures includes the first portion and the second portion having different average grain dimensions.

7. The microelectronic assembly according to claim 1, wherein an average grain length of grains in the second portion is at least about 1 micron and wherein an average grain width of grains in the second portion is at least 20% smaller than the average grain length.

8. The microelectronic assembly according to claim 1, wherein the second portion includes nanotwinned copper, and wherein the first portion includes an electrically conductive material other than the nanotwinned copper.

9. The microelectronic assembly according to claim 1, wherein a thickness of the first portion is at least about 400 nanometers and wherein a thickness of the second portion is less than about 300 nanometers.

10. The microelectronic assembly according to claim 1, wherein the direct bonding contact further includes a third portion, the second portion is between the first portion and the third portion, and the first portion and the third portion have substantially same microstructures.

11. The microelectronic assembly according to claim 1, wherein the direct bonding contact further includes a third portion, the second portion is between the first portion and the third portion, and the second portion and the third portion have different microstructures.

12. The microelectronic assembly according to claim 1, wherein the direct bonding region further includes a direct bonding dielectric comprising a first portion and a second portion, the first portion of the direct bonding dielectric is between the first microelectronic component and the second portion of the direct bonding dielectric, and an atomic percentage of carbon in the first portion of the direct bonding dielectric is lower than an atomic percentage of carbon in the second portion of the direct bonding dielectric.

13. The microelectronic assembly according to claim 12, wherein the atomic percentage of carbon in the first portion of the direct bonding dielectric is below 25%, and wherein the atomic percentage of carbon in the second portion of the direct bonding dielectric is above 25%.

14. The microelectronic assembly according to claim 12, wherein a thickness of the first portion of the direct bonding dielectric is at least 300 nanometers and wherein a thickness of the second portion of the direct bonding dielectric is less than 300 nanometers.

15. The microelectronic assembly according to claim 12, wherein the direct bonding dielectric further includes silicon and nitrogen.

16. The microelectronic assembly according to claim 1, wherein the first microelectronic component is a die and the second microelectronic component is one of a further die, an interposer, a package substrate, or a circuit board.

17. A microelectronic assembly, comprising:

a first microelectronic component; and a second microelectronic component coupled to the first microelectronic component by a direct bonding contact, wherein the direct bonding contact includes a first portion and a second portion, the first portion is between the first microelectronic component and the second portion, less than about 40% of grains of the first portion have a <111> orientation, and at least about 50% of grains of the second portion have the <111> orientation.

18. The microelectronic assembly according to claim 17, further comprising a direct bonding dielectric between the first microelectronic component and the second microelectronic component, wherein:

the direct bonding dielectric encloses sidewalls of the direct bonding contact, the direct bonding dielectric includes a first portion and a second portion, the first portion of the direct bonding dielectric is between the first microelectronic component and the second portion of the direct bonding dielectric, and an atomic percentage of carbon in the first portion of the direct bonding dielectric is lower than an atomic percentage of carbon in the second portion of the direct bonding dielectric.

19. A microelectronic assembly, comprising:

a first microelectronic component; and a second microelectronic component coupled to the first microelectronic component by a direct bonding contact, wherein the direct bonding contact includes a first portion and a second portion, the first portion is between the first microelectronic component and the second portion, the first portion includes polycrystalline copper or fine-grained copper, and the second portion includes nanotwinned copper.

20. The microelectronic assembly according to claim 19, further comprising a direct bonding dielectric between the first microelectronic component and the second microelectronic component, wherein:

the direct bonding dielectric encloses sidewalls of the direct bonding contact, the direct bonding dielectric includes a first portion and a second portion, the first portion of the direct bonding dielectric is between the first microelectronic component and the second portion of the direct bonding dielectric, and an atomic percentage of carbon in the first portion of the direct bonding dielectric is lower than an atomic percentage of carbon in the second portion of the direct bonding dielectric.

* * * * *